United States Patent
Greenlee et al.

(10) Patent No.: US 11,031,417 B2
(45) Date of Patent: *Jun. 8, 2021

(54) METHODS USED IN FORMING AN ARRAY OF ELEVATIONALLY-EXTENDING TRANSISTORS

(71) Applicant: Micron Technology, Inc., Boise, ID (US)

(72) Inventors: Jordan D. Greenlee, Boise, ID (US); John Mark Meldrim, Boise, ID (US); E. Allen McTeer, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/903,201

(22) Filed: Jun. 16, 2020

(65) Prior Publication Data

US 2020/0312880 A1    Oct. 1, 2020

Related U.S. Application Data

(62) Division of application No. 16/430,713, filed on Jun. 4, 2019, now Pat. No. 10,727,250, which is a division of application No. 15/710,432, filed on Sep. 20, 2017, now Pat. No. 10,361,216.

(51) Int. Cl.
*H01L 27/11582*    (2017.01)
*H01L 27/11556*    (2017.01)
*H01L 27/11565*    (2017.01)

(52) U.S. Cl.
CPC .. *H01L 27/11582* (2013.01); *H01L 27/11556* (2013.01); *H01L 27/11565* (2013.01)

(58) Field of Classification Search
CPC combination set(s) only.
See application file for complete search history.

(56) References Cited

U.S. PATENT DOCUMENTS

| | | | |
|---|---|---|---|
| 9,230,987 B2 | 1/2016 | Pachamuthu et al. |
| 9,728,551 B1 | 8/2017 | Lu et al. |
| 9,754,946 B1 | 9/2017 | Yang et al. |
| 9,779,948 B1 | 10/2017 | Baraskar et al. |
| 9,853,043 B2 | 12/2017 | Lu et al. |
| 9,991,280 B2 | 6/2018 | Nakamura et al. |

(Continued)

FOREIGN PATENT DOCUMENTS

| | | |
|---|---|---|
| WO | WO 2016/149389 | 9/2016 |
| WO | WO PCT/US2018/048393 | 1/2019 |
| WO | WO PCT/US2018/049393 | 1/2019 |

*Primary Examiner* — Mounir S Amer
(74) *Attorney, Agent, or Firm* — Wells St. John P.S.

(57) ABSTRACT

A method used in forming an array of elevationally-extending transistors comprises forming vertically-alternating tiers of insulating material and void space. Such method includes forming (a) individual longitudinally-aligned channel openings extending elevationally through the insulating-material tiers, and (b) horizontally-elongated trenches extending elevationally through the insulating-material tiers. The void-space tiers are filled with conductive material by flowing the conductive material or one or more precursors thereof through at least one of (a) and (b) to into the void-space tiers. After the filling, transistor channel material is formed in the individual channel openings along the insulating-material tiers and along the conductive material in the filled void-space tiers.

20 Claims, 26 Drawing Sheets

(56) References Cited

U.S. PATENT DOCUMENTS

| | | |
|---|---|---|
| 10,361,216 B2 * | 7/2019 | Greenlee .......... H01L 27/11556 |
| 2011/0287612 A1 | 11/2011 | Lee et al. |
| 2012/0256247 A1 | 10/2012 | Alsmeier |
| 2013/0069139 A1 | 3/2013 | Ishihara et al. |
| 2013/0148398 A1 | 6/2013 | Baek et al. |
| 2013/0313718 A1 | 11/2013 | Varghese et al. |
| 2015/0194436 A1 | 7/2015 | Lee |
| 2016/0225822 A1 | 8/2016 | Tang et al. |
| 2016/0260733 A1 | 9/2016 | Lue |
| 2017/0033119 A1 | 2/2017 | Park et al. |
| 2017/0263643 A1 | 9/2017 | Shim et al. |

* cited by examiner

METHODS USED IN FORMING AN ARRAY OF ELEVATIONALLY-EXTENDING TRANSISTORS

RELATED PATENT DATA

This patent resulted from a divisional application of U.S. patent application Ser. No. 16/430,713, filed Jun. 4, 2019, entitled "Methods Used In Forming An Array Of Elevationally-Extending Transistors", naming Jordan D. Greenlee, John Mark Meldrim, and E. Allen McTeer as inventors, which was a divisional application of U.S. patent application Ser. No. 15/710,432, filed Sep. 20, 2017, entitled "Methods Used In Forming An Array Of Elevationally-Extending Transistors", naming Jordan D. Greenlee, John Mark Meldrim, and E. Allen McTeer as inventors, now U.S. Pat. No. 10,361,216, the disclosures of which are incorporated by reference.

TECHNICAL FIELD

Embodiments disclosed herein pertain to methods of forming an array of elevationally-extending transistors.

BACKGROUND

Memory is one type of integrated circuitry, and is used in computer systems for storing data. Memory may be fabricated in one or more arrays of individual memory cells. Memory cells may be written to, or read from, using digit lines (which may also be referred to as bit lines, data lines, or sense lines) and access lines (which may also be referred to as word lines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates, and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor.

Vertical transistors may be formed in arrays not necessarily constituting memory cells.

DETAILED DESCRIPTION OF EXAMPLE EMBODIMENTS

Embodiments of the invention encompass methods used in forming an array of elevationally-extending transistors, for example as might be used in an array of memory circuitry comprising programmable charge-storage transistors. A first example embodiment is shown in and described with reference to FIGS. 1-11.

Figure 1:
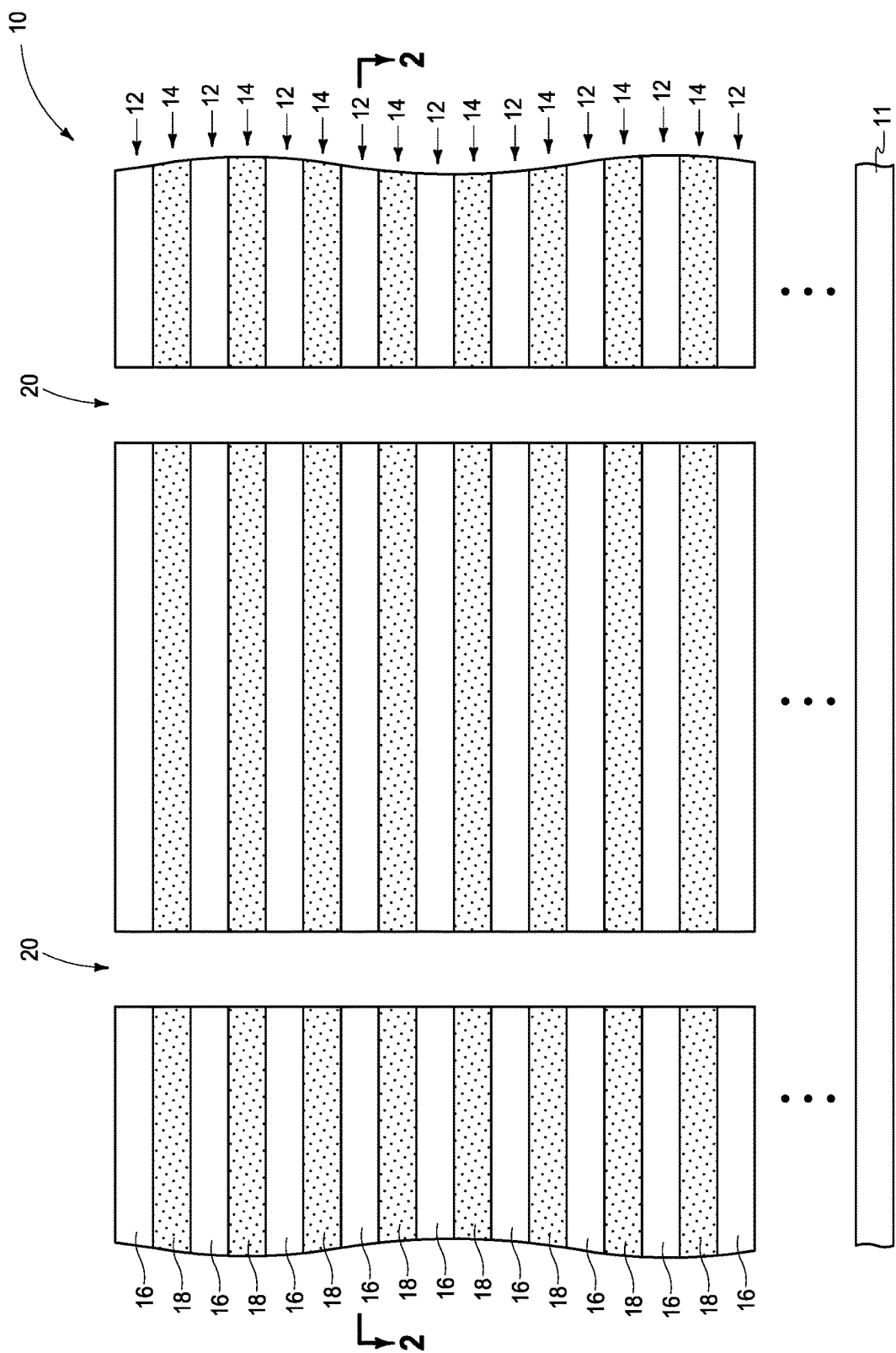
FIG. 1 is a diagrammatic cross-sectional view of a substrate construction in process in accordance with an embodiment of the invention, and is taken through line 1-1 in FIG. 2.
Figure 2:
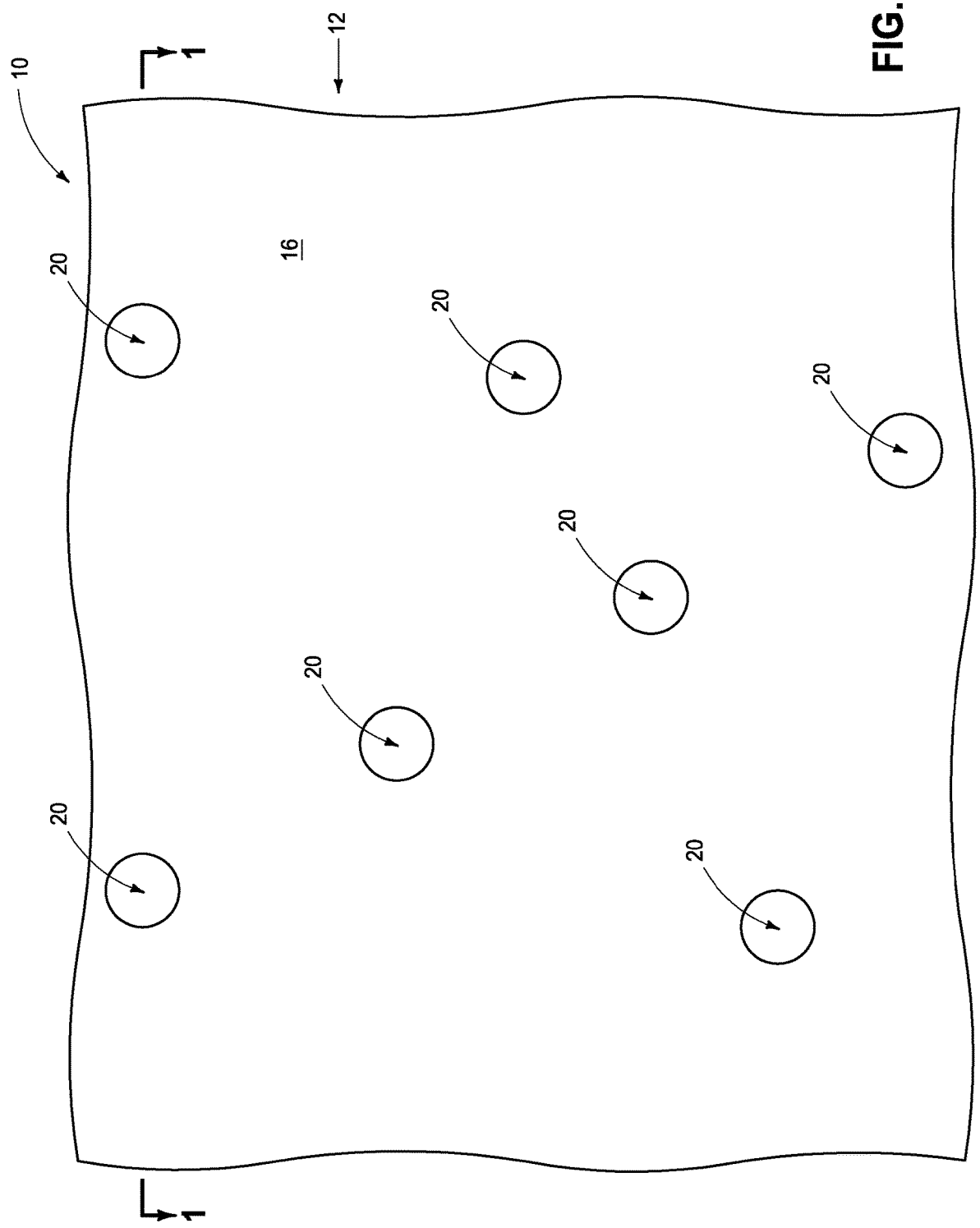
FIG. 2 is a diagrammatic cross-sectional view taken through line 2-2 in FIG. 1.

Referring to FIGS. 1 and 2, a construction 10 comprises a base substrate 11 that may include any one or more of conductive/conductor/conducting (i.e., electrically herein), semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 1 and 2—depicted materials. For example, other partially or wholly fabricated components of integrated circuitry may be provided somewhere above, about, or within base substrate 11. Control and/or other peripheral circuitry for operating components within an array of transistors may also be fabricated, and may or may not be wholly or partially within a transistor array or sub-array. Further, multiple sub-arrays may also be fabricated and operated independently, in tandem, or otherwise relative one another. As used in this document, a "sub-array" may also be considered as an array.

Vertically-alternating tiers 12 and 14 of different composition first material 16 and second material 18 have been formed relative to or above base substrate 11. Construction 10 is shown as having seventeen vertically-alternating tiers 12 and 14 in FIG. 1 although fewer or likely many more (e.g., dozens, hundreds, etc.) may be formed. Accordingly, more tiers 12 and 14 may be below the depicted tiers and above base substrate 11 and/or more tiers 12 and 14 may be above the depicted tiers. First material 16 comprises insulative material as some or all of such remains in a finished construction of the array and electrically isolates certain features elevationally between different tiers 14. Second material 18 may be wholly sacrificial, and accordingly may comprise any one or more of conductive, semiconductive, and insulative materials. One example first material 16 is silicon dioxide, and one example second material 18 is silicon nitride. Such may be formed to be of the same or different thicknesses relative one another, and each need not be of the same respective thickness within the example depicted stack of materials 16, 18. Elevationally-extending dummy-structure openings 20 have been formed into vertically-alternating tiers 12 and 14. Such are optionally shown as being circular and of the same size and shape relative one another. Such may be formed, by way of example only, by photolithographic pattering and etch with or without pitch multiplication.

Figure 3:
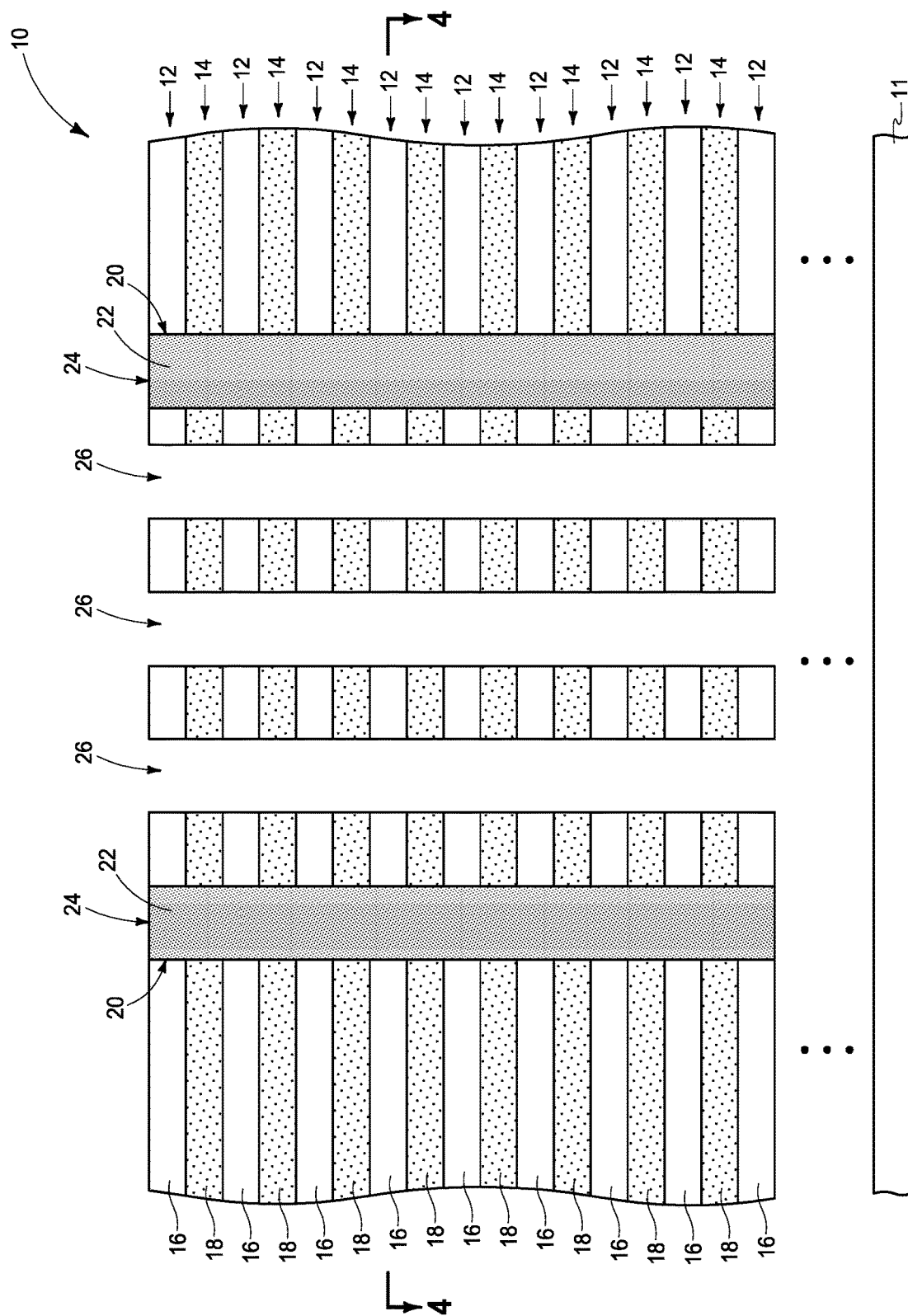
FIG. 3 is a view of the FIG. 1 construction at a processing step subsequent to that shown by FIG. 1, and is taken through line 3-3 in FIG. 4.
Figure 4:
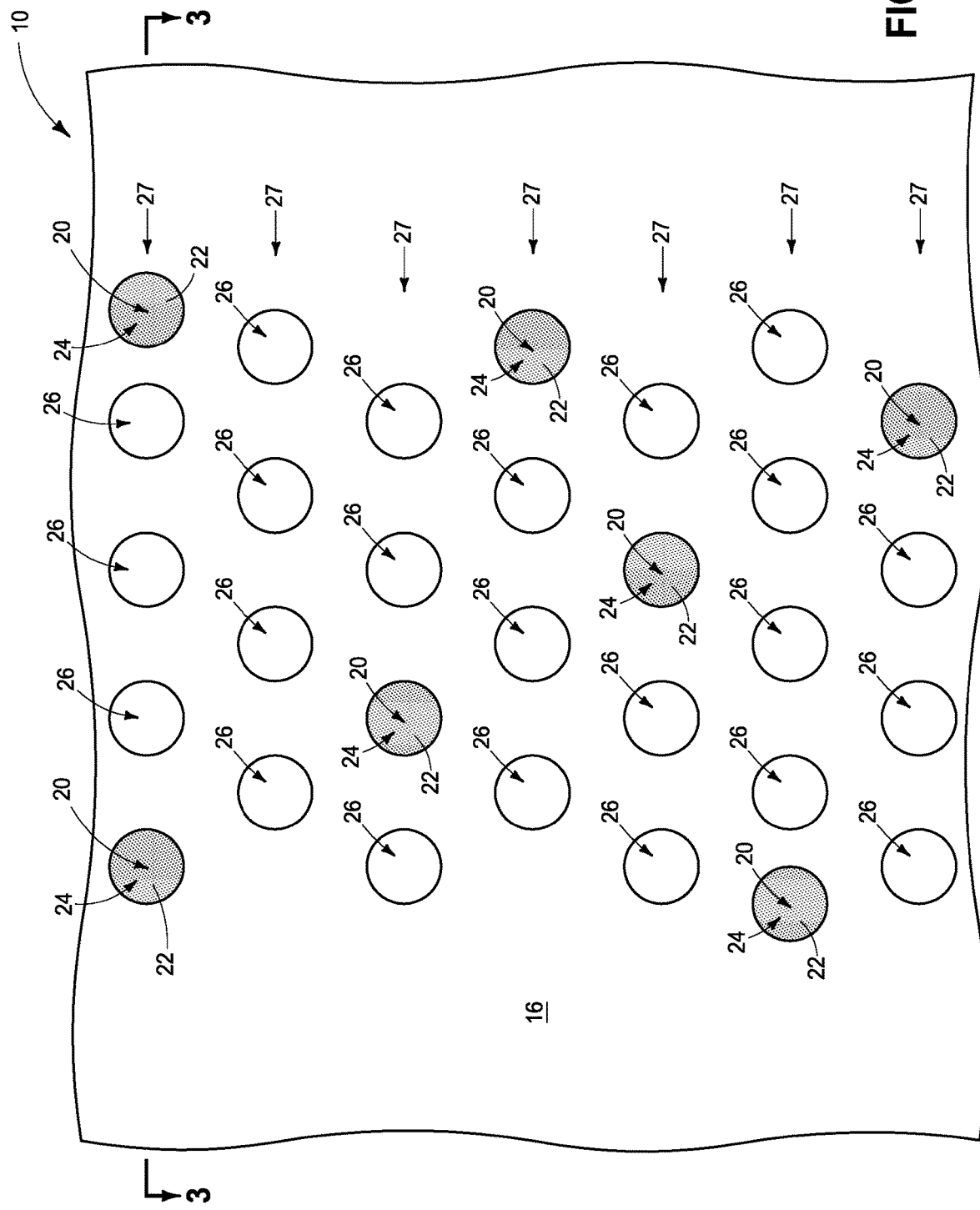
FIG. 4 is a view taken through line 4-4 in FIG. 3.

Referring to FIGS. 3 and 4, solid material 22 (e.g., silicon dioxide) has been formed within dummy-structure openings 20 thereby forming dummy structures 24. In one embodiment, solid material 22 completely fills dummy-structure openings 20, and in one embodiment forms dummy structures 24 to be completely-solid elevationally-extending pillars. Alternately and by way of example only, such may comprise a hollow elevationally-extending central portion (not shown). Dummy structures 24 may comprise multiple different composition materials with a radially/laterally outermost portion thereof being insulative (e.g., silicon dioxide).

Elevationally-extending channel openings 26 have been formed into vertically-alternating tiers 12 and 14, and in one embodiment after forming dummy structures 24. Alternate processing may be conducted, for example whereby the dummy-structure openings and channel openings are formed at the same time, then filled with solid material at the same time, then masking of the dummy structures, and then the material within channel openings 26 removed therefrom. Regardless, in one embodiment, ratio of a total number of channel openings 26 to a total number of dummy structures 24 is from 20:1 to 4:1. Channel openings 26 may optionally be of the same size and shape relative one another and optionally of the same size and shape relative dummy-structure openings 20.

Further, and by way of example only, the structure depicted by FIG. 4 may be considered as forming rows 27 of channel openings 26 that individually are offset relative one another. In one embodiment, rows 27 may be considered as comprising four channel openings 26 wherein, in some rows 27, a dummy structure 24 has been substituted for a channel opening 26 and/or an additional dummy structure 24 has been added (e.g., one having been added in the first and sixth rows counting from the top, with one substitution occurring in the first, third, fourth, and seventh rows). Alternately, dummy structures 24 may not be substituted for a channel opening in any one or more channel-opening rows 27 (e.g., no substitution shown as having occurred in the second and sixth rows). Further, and regardless, dummy structures 24 and channel openings 26 may be arrayed in respective periodic repeating patterns, or may not so arrayed as is shown with respect to each of dummy structures 24 and channel openings 26 in FIG. 4.

Figure 5:
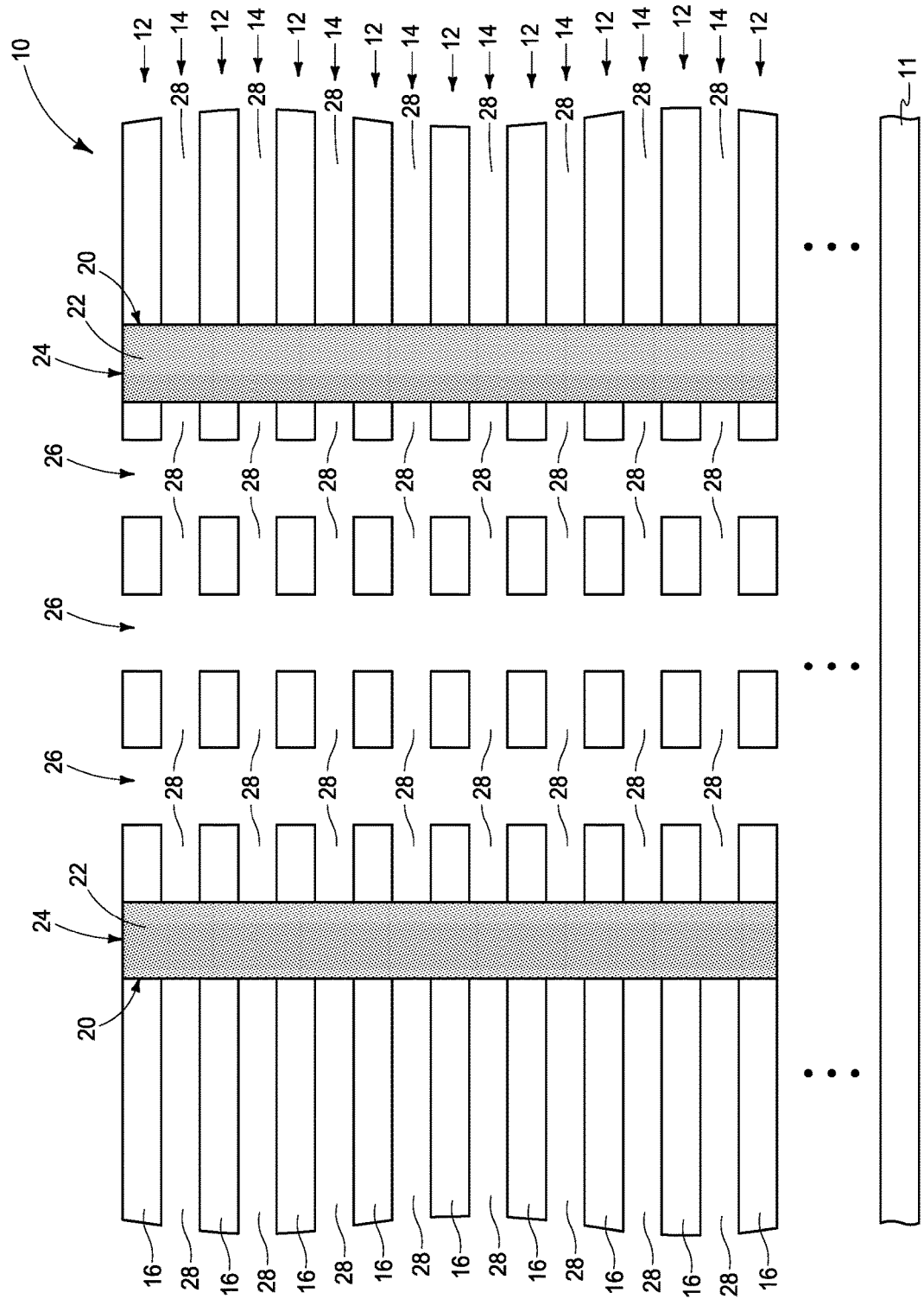
FIG. 5 is a view of the FIG. 3 construction at a processing step subsequent to that shown by FIG. 3.

Referring to FIG. 5, an etchant has been flowed into channel openings 26 and which etches at least some (all being shown) of second material 18 (not shown, due to it all having been removed) of second-material tiers 14 and selectively relative to dummy structures 24. Such has thereby formed void space 28 elevationally between immediately-adjacent first-material tiers 12, and which in some embodiments may be considered as void-space tiers 14. The etchant may be any suitable dry and/or wet etchant (including more than one etchant, regardless of whether wet or dry) that selectively etches material 18 relative to material 16. Where material 18 is silicon nitride and material 16 and at least the radially outermost portion of dummy structures 24 is silicon dioxide, an example etchant is $H_3PO_4$.

Figure 6:
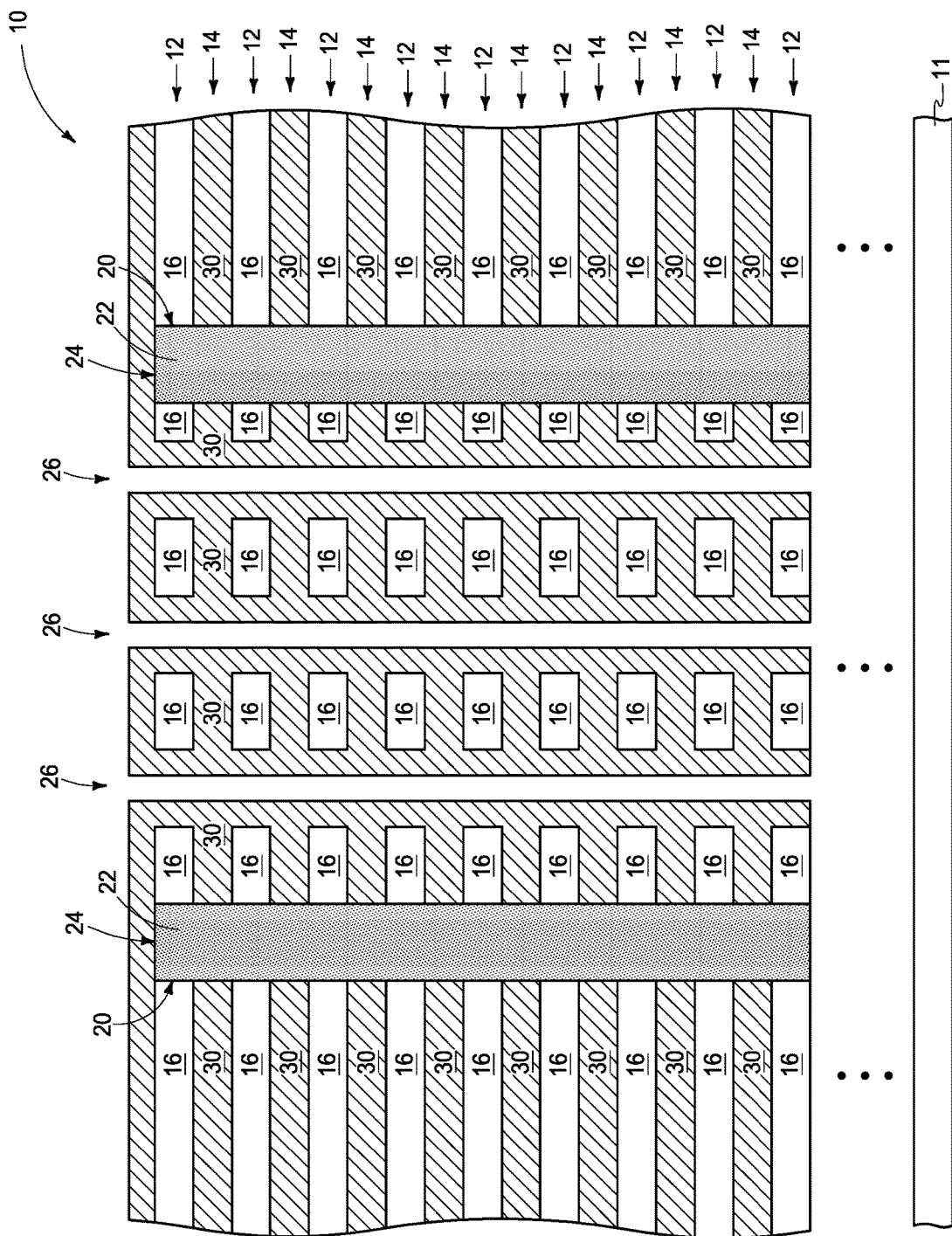
FIG. 6 is a view of the FIG. 5 construction at a processing step subsequent to that shown by FIG. 5.

Referring to FIG. 6, void space 28 has been filled with conductive material 30 by flowing conductive material 30 (or one or more precursors thereof) through channel openings 26 to into void space 28 with, in one embodiment, conductive material 30 also being formed elevationally along first-material tiers 12 within individual channel openings 26. Conductive material 30 may be formed by any suitable existing or yet-to-be-developed manner(s), for example physical vapor deposition, chemical vapor deposition, and/or atomic layer deposition. Example conductive materials 30 are metal materials and conductively-doped semiconductive materials, with two examples being tungsten and conductively-doped polysilicon. Where such is formed by chemical vapor deposition or atomic layer deposition, an example precursor for such materials includes $WF_6$ and a suitable silane, respectively. In one embodiment and as described and shown below, conductive material 30 may form a control gate of a charge-storage transistor and comprise part of an access line electrically coupling a row line or column line of such transistors.

Figure 7:
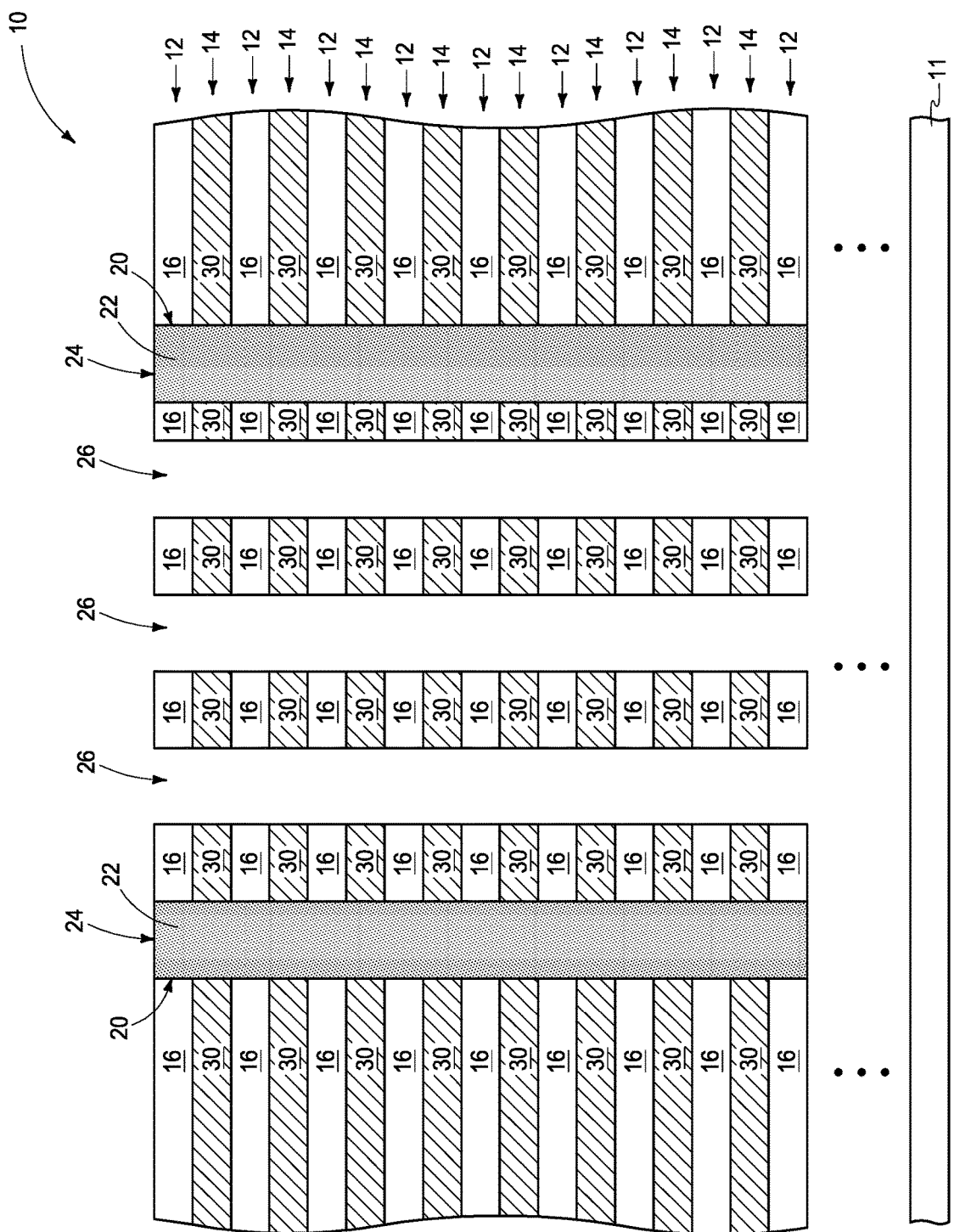
FIG. 7 is a view of the FIG. 6 construction at a processing step subsequent to that shown by FIG. 6.

Referring to FIG. 7, conductive material 30 has been removed (e.g., by any suitable dry anisotropic etch) from being elevationally along first-material tiers 12 within individual channel openings 26.

Figure 8:
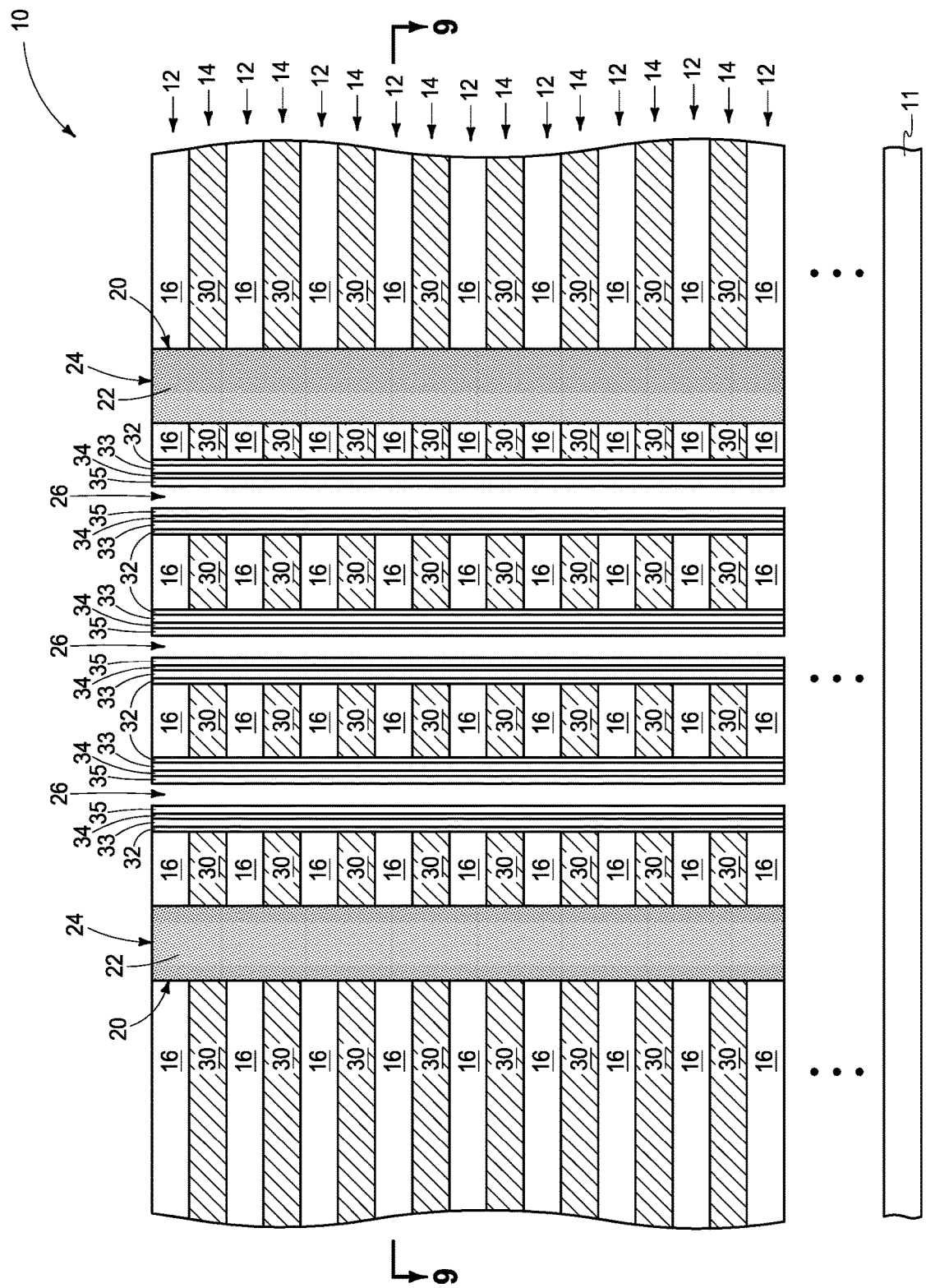
FIG. 8 is a view of the FIG. 7 construction at a processing step subsequent to that shown by FIG. 7, and is taken through line 8-8 in FIG. 9.
Figure 9:
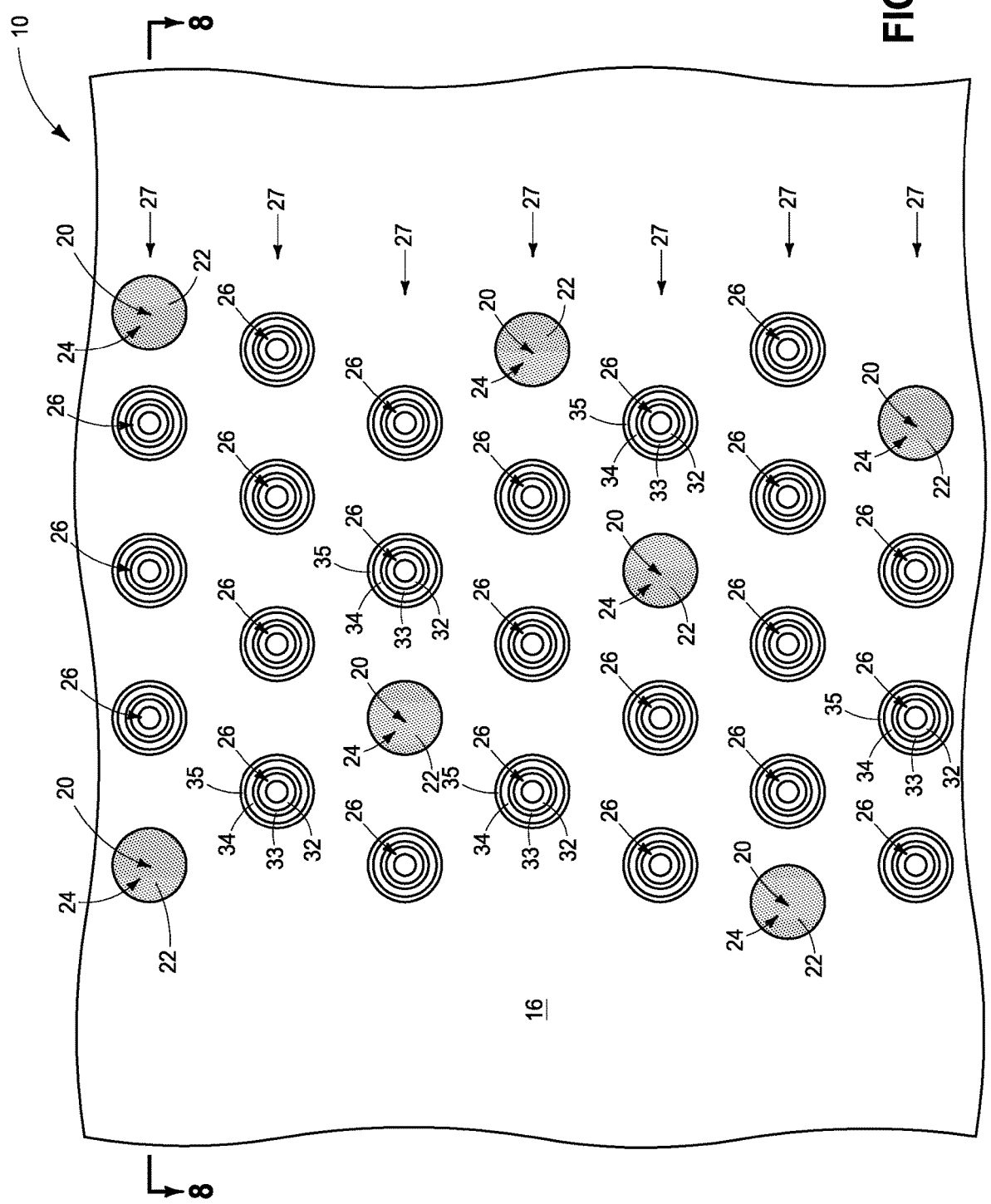
FIG. 9 is a view taken through line 9-9 in FIG. 8.

Solid material comprising transistor channel material is ultimately formed in individual channel openings 26 along the insulating-material tiers and along the conductive material in the filled void space after removing the conductive material within channel openings 26 as shown in FIG. 7. One example such embodiment is shown in FIGS. 8 and 9 for fabrication of charge-storage transistors. For example, and in one embodiment, FIGS. 8 and 9 show deposition of a charge-blocking material 32 (e.g., silicon dioxide and/or silicon nitride), a charge-storage material 33 (e.g., floating gate material [doped or undoped silicon, etc.] or charge-trapping material [silicon nitride, metal dots, etc.]), a charge-passage material 34 (e.g., a bandgap-engineered structure having nitrogen-containing material [silicon nitride] laterally sandwiched between two insulator oxides [silicon dioxide]), and transistor channel material 35 (e.g., suitably doped polysilicon, etc.) in individual channel openings 26 along insulating-material tiers 12 and along conductive material 30 in filled void space 28. Conductive material 30 may be laterally recessed (not shown) back from original channel openings 26 prior to deposition of charge-blocking material 32.

Figure 10:
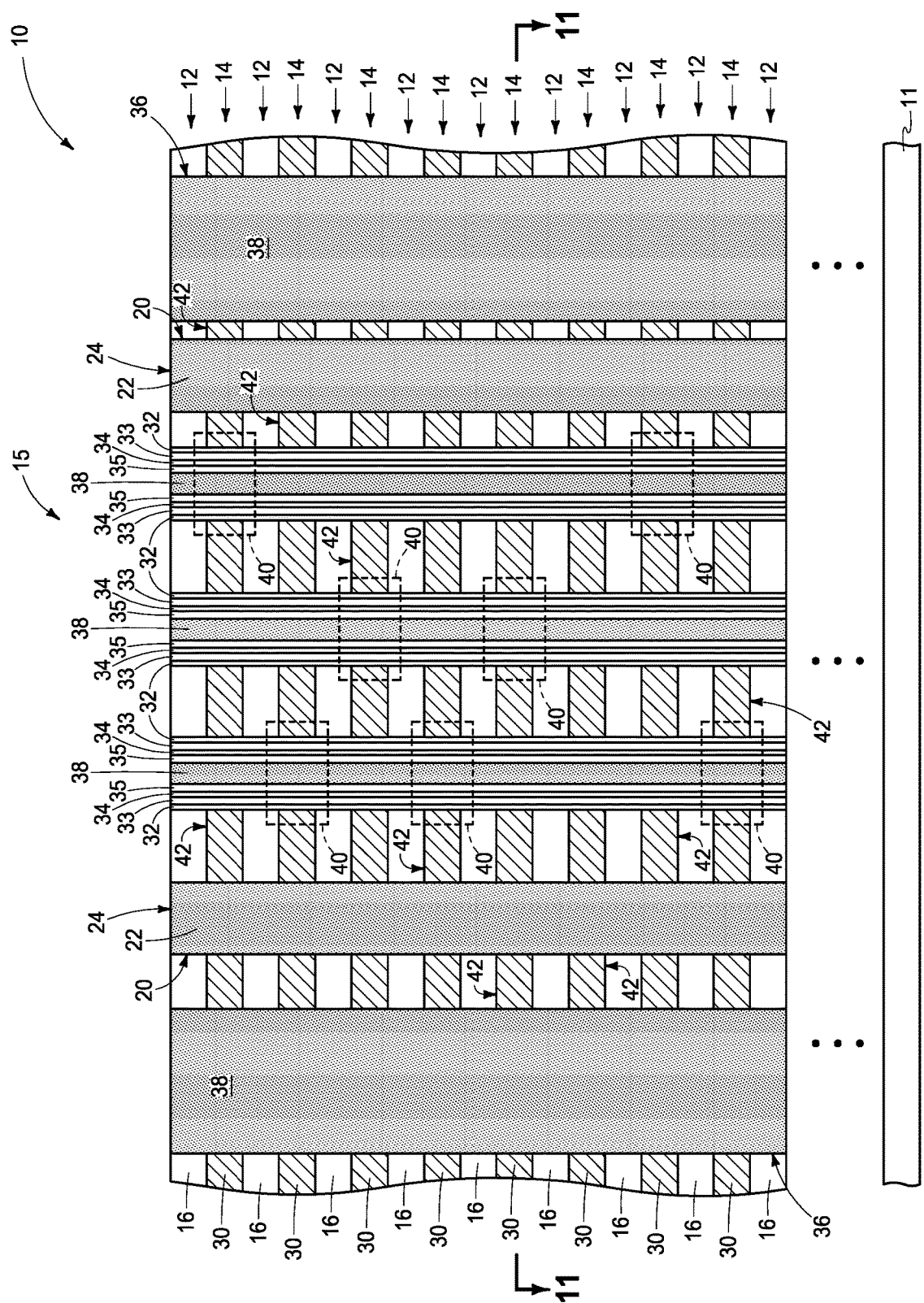
FIG. 10 is a view of the FIG. 8 construction at a processing step subsequent to that shown by FIG. 8, and is taken through line 10-10 in FIG. 11.
Figure 11:
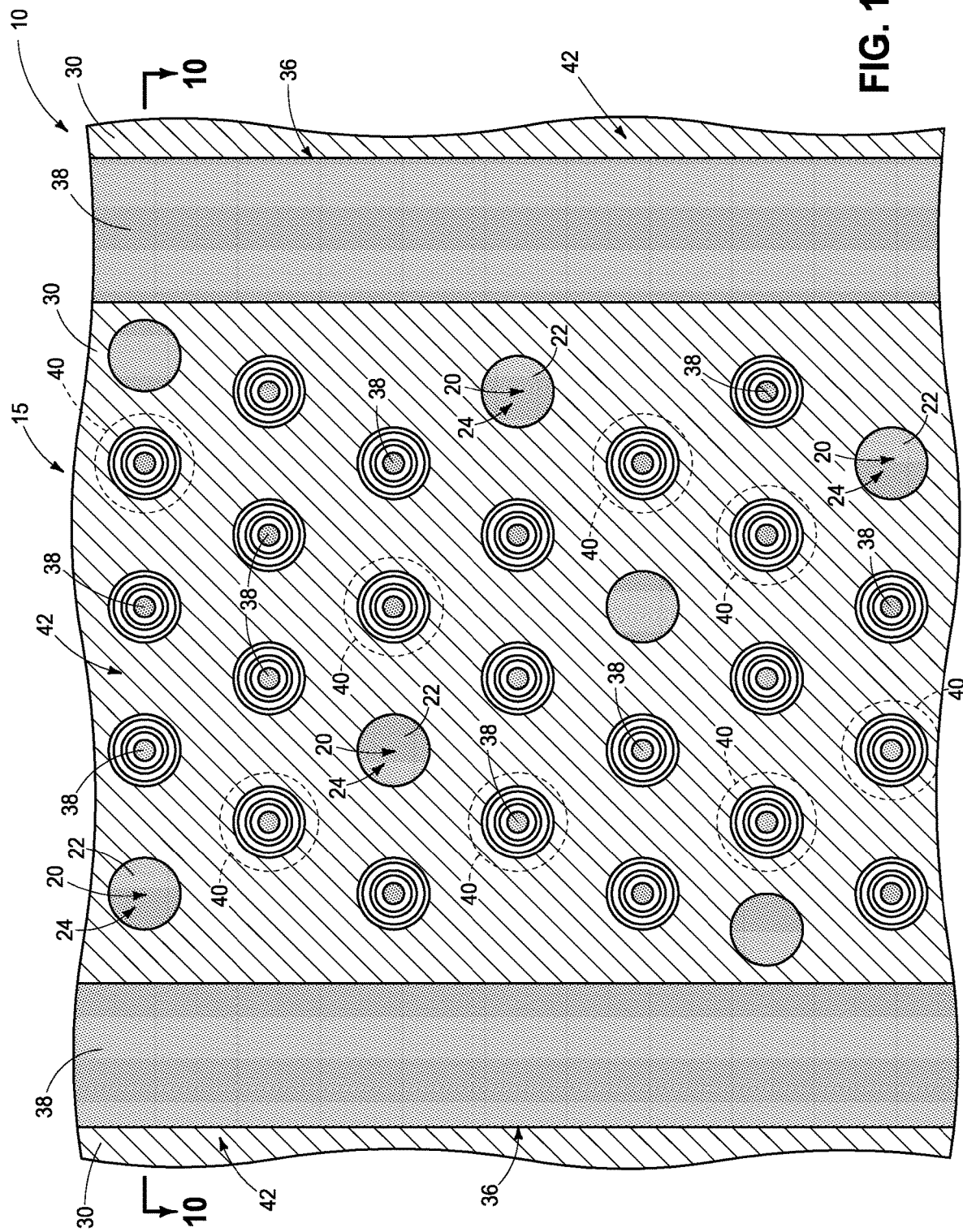
FIG. 11 is a view taken through line 11-11 in FIG. 10.

Referring to FIGS. 10 and 11, horizontally-elongated trenches 36 have been formed to extend elevationally into first material trenches 12 (e.g., and conductive material 30), and solid material 38 has been formed therein. Ideally, solid material 38 is insulative (e.g., silicon dioxide) and also fills remaining volume of channel openings 26. In one such embodiment and as shown, trenches 36 and solid material 38 therein have been formed after forming channel openings 26 and transistor channel material 35 therein. Alternately, such trenches and solid material therein may be formed before forming transistor channel material 35 and/or channel openings 26.

Figure 12:
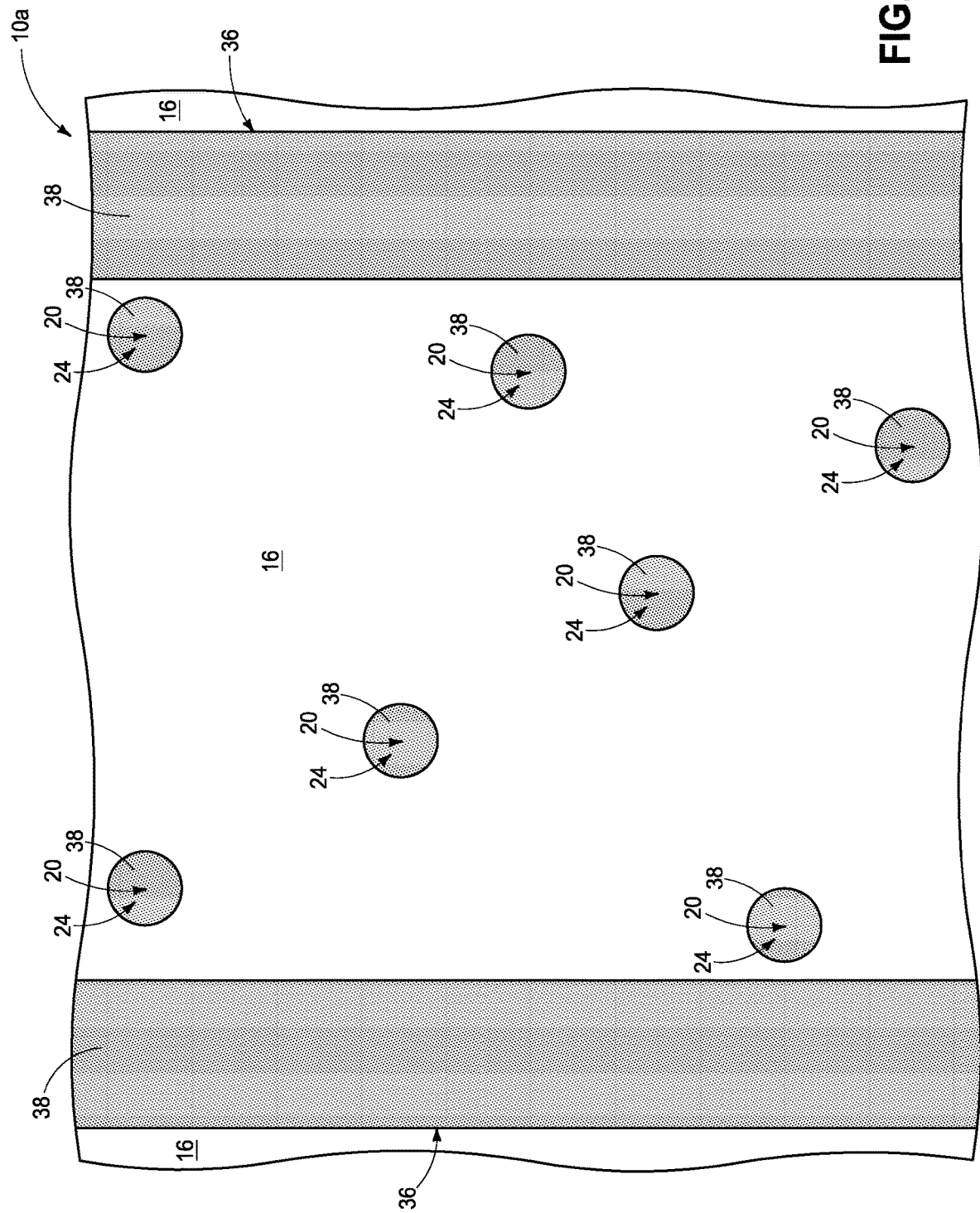
FIG. 12 is a diagrammatic cross-sectional view of a substrate construction in process in accordance with an embodiment of the invention.

For example, and by way of example only, an alternate construction 10a is shown in and described with reference to FIG. 12. Like numerals from the above-described embodiments have been used where appropriate, with some construction differences being indicated with the suffix "a". FIG. 12 shows alternate example processing to that depicted by FIG. 4 wherein, for example, trenches 36 and solid material 38 therein have been formed prior to forming channel openings 26 (not shown) and accordingly any transistor channel material therein. For example, trenches 36 may be formed commensurate with forming of dummy-structure openings 20, and with such openings 20 and trenches 36 being simultaneously filled with solid material 38. Any other attribute(s) or aspect(s) as shown and/or described herein with respect to other embodiments may be used.

FIGS. 10 and 11 by way of example show fabrication being completed with respect to formation of an array 15 of example transistors 40 (e.g., charge-storage transistors), and which comprise an access line 42 interconnecting multiple transistors 40 along, for example, a row or column. Conductive material 30 in FIG. 11 as shown left and right of trenches 36 and material 38 therein would comprise a separately controllable/accessible access line 42 (not numerically designated in FIG. 10). Any other attribute(s) or aspect(s) as shown and/or described herein with respect to other embodiments may be used.

Another example method used in forming an array of elevationally-extending transistors is shown in and next described with reference to FIGS. 13-17 with respect to a construction 10b. Like numerals from the above-described embodiments have been used where appropriate, with some construction differences being indicated with the suffix "b" or with different numerals.

Figure 13:
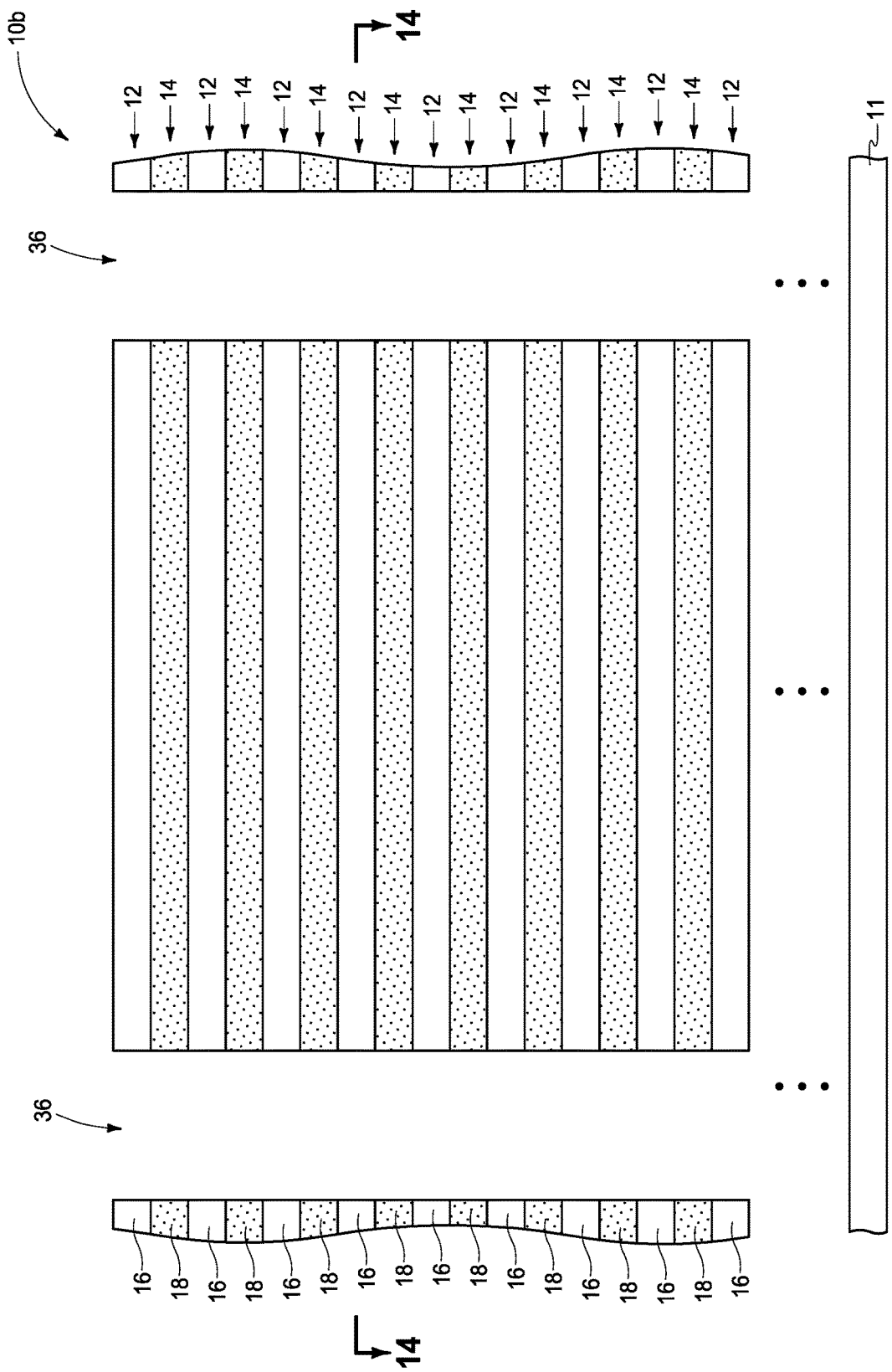
FIG. 13 is a diagrammatic cross-sectional view of a substrate construction in process in accordance with an embodiment of the invention, and is taken through line 13-13 in FIG. 14.
Figure 14:
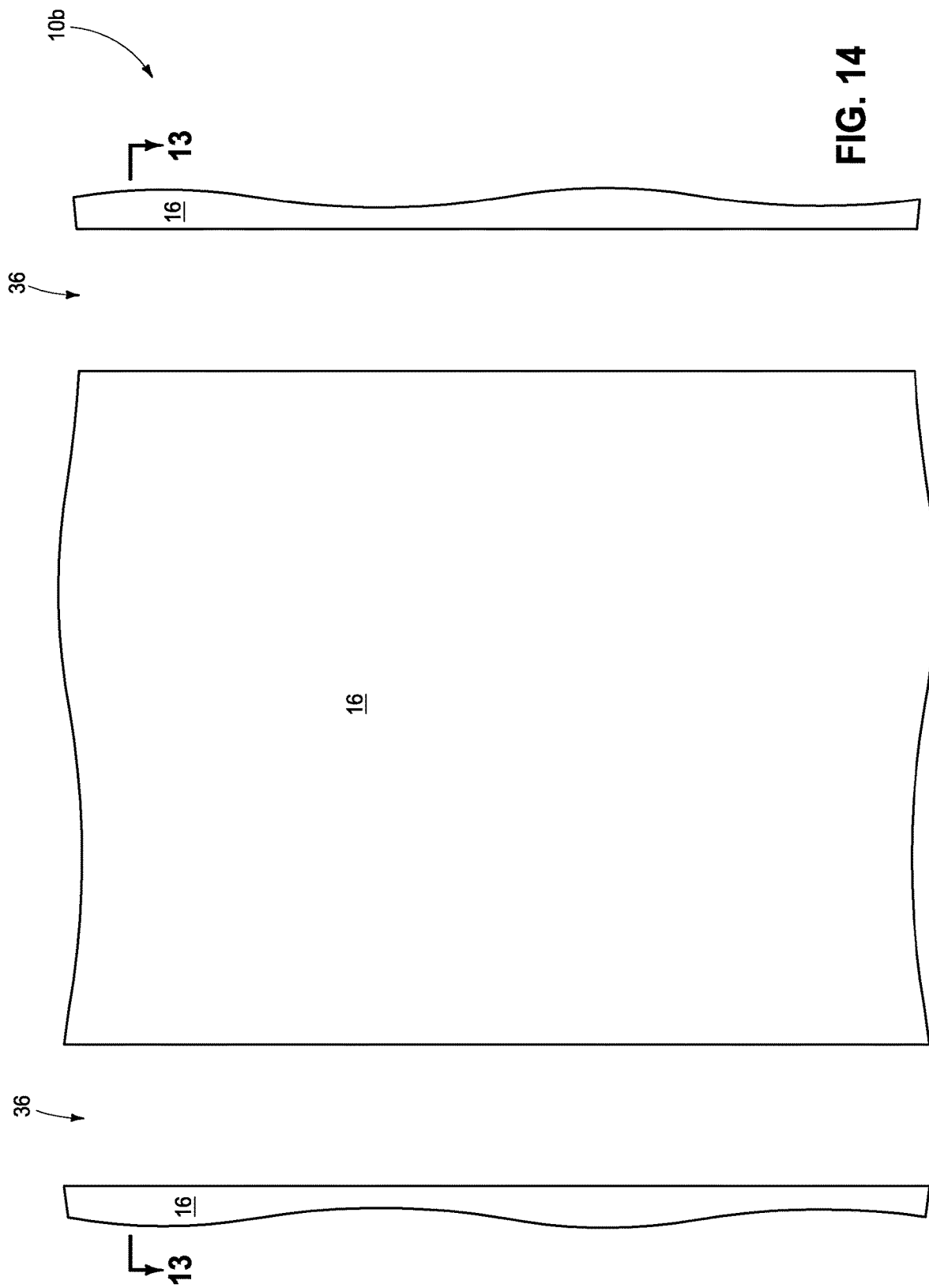
FIG. 14 is a diagrammatic cross-sectional view taken through line 14-14 in FIG. 13.

Referring to FIGS. 13 and 14, horizontally-elongated trenches 36 have been formed which extend elevationally into vertically-alternating tiers 12 and 14.

Figure 15:
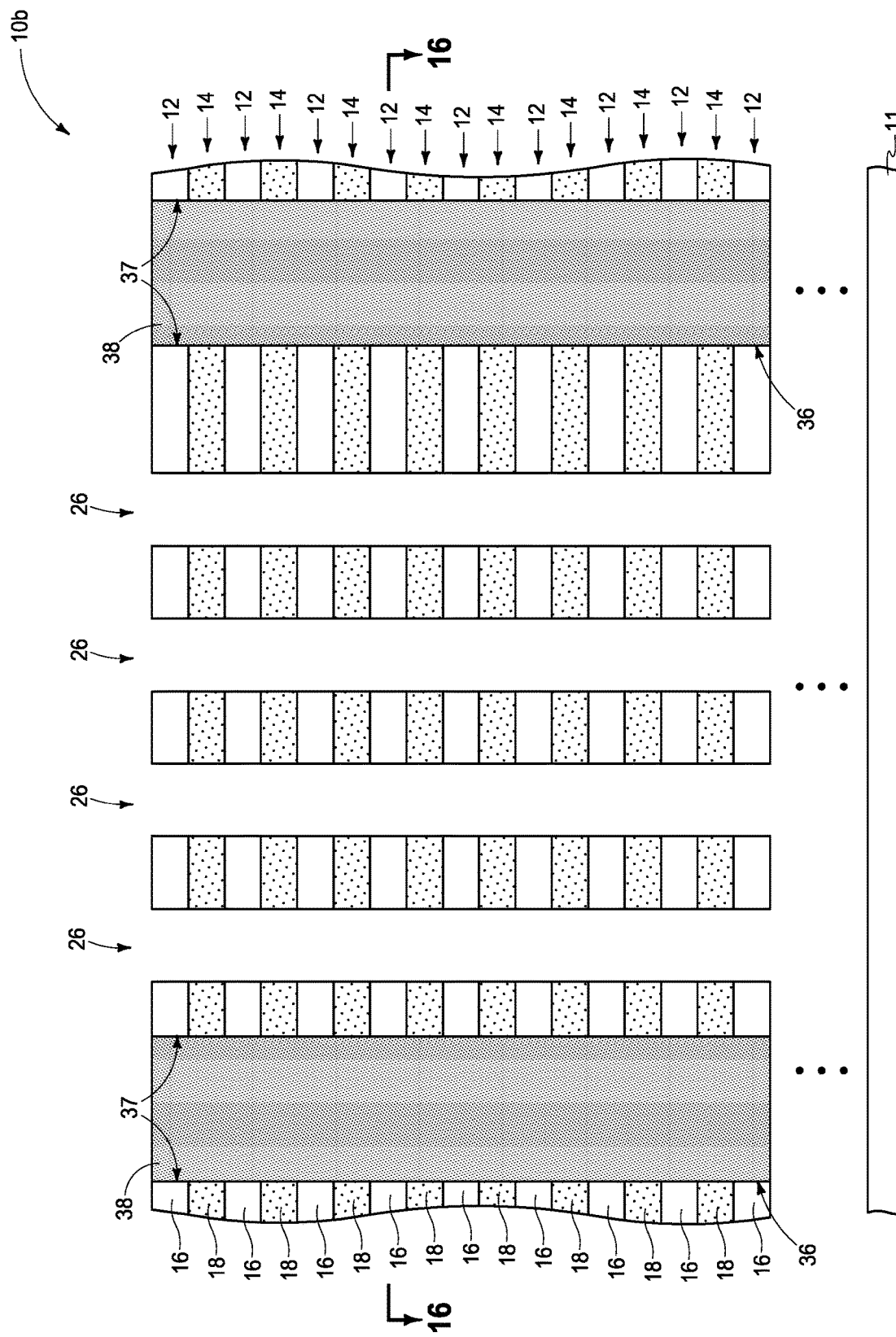
FIG. 15 is a view of the FIG. 13 construction at a processing step subsequent to that shown by FIG. 13, and is taken through line 15-15 in FIG. 16.
Figure 16:
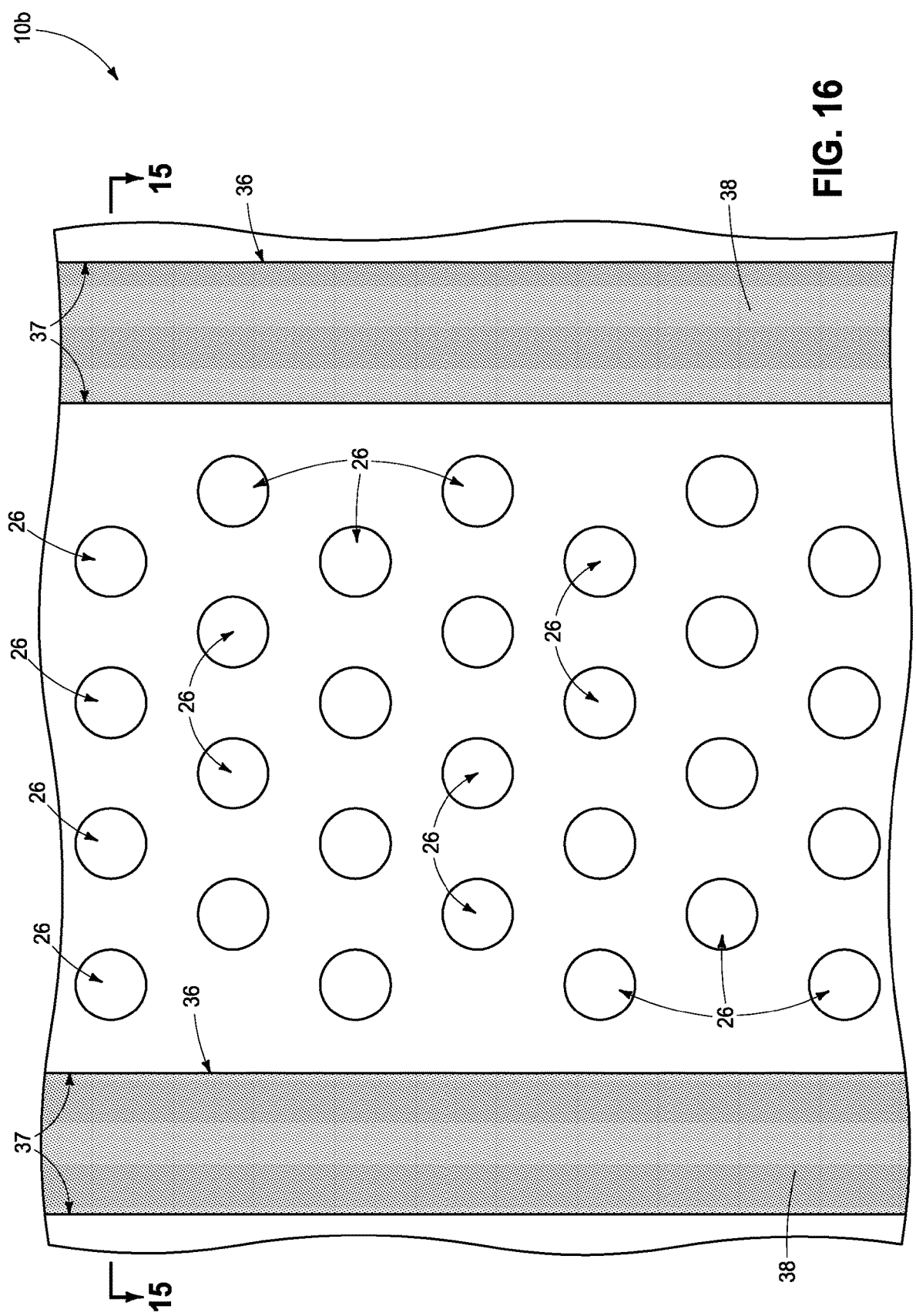
FIG. 16 is a view taken through line 16-16 in FIG. 15.

Referring to FIGS. 15 and 16, solid material 38 has been formed within trenches 36, with at least a laterally-outermost portion thereof along longitudinal sides 37 of individual trenches 36 being insulative. Elevationally-extending channel openings 26 have been formed into vertically-alternating tiers 12 and 14 and, in one embodiment, after forming solid material 38 and laterally there-between.

Figure 17:
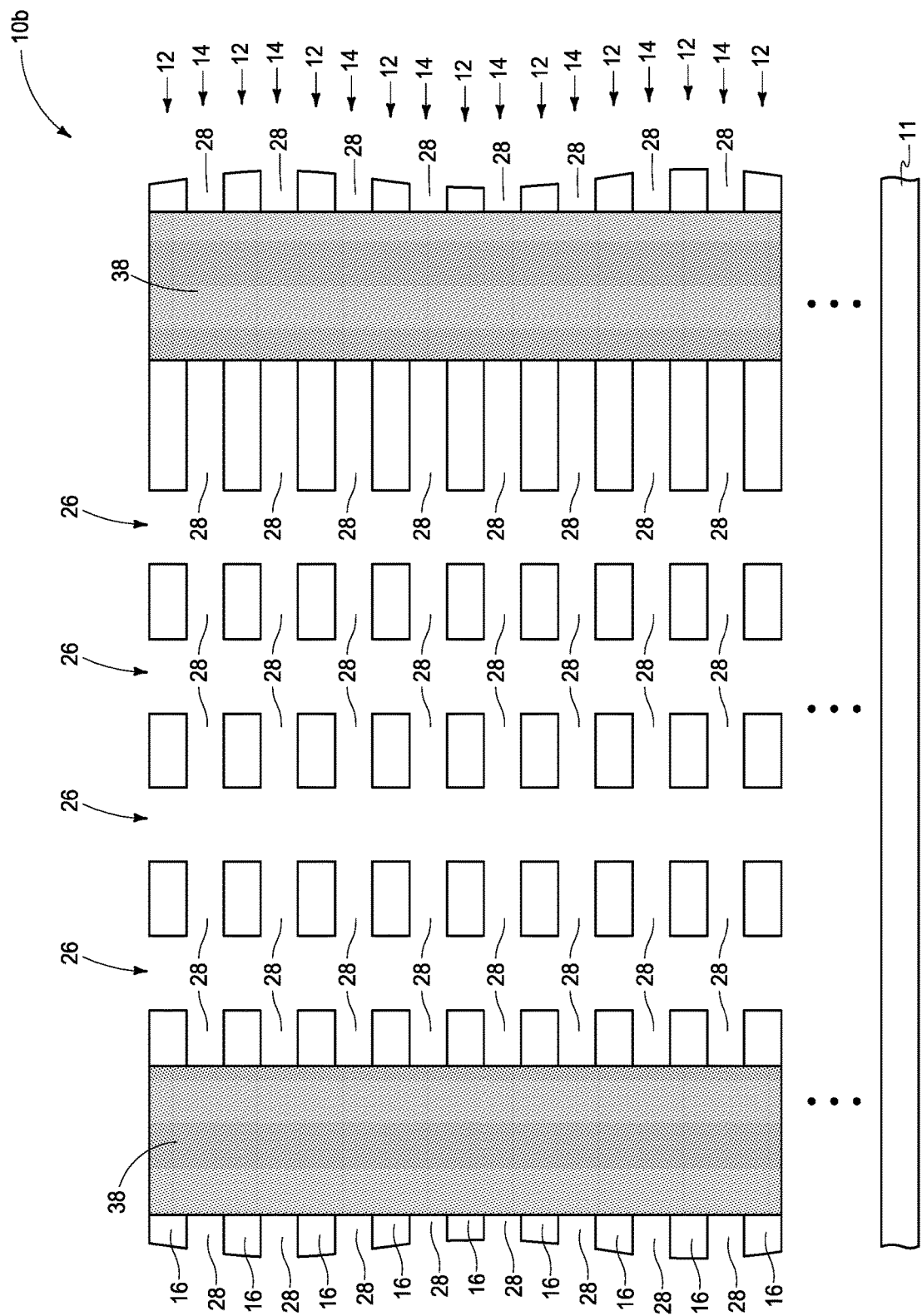
FIG. 17 is a view of the FIG. 15 construction at a processing step subsequent to that shown by FIG. 15.

Referring to FIG. 17, etchant has been flowed into channel openings 26 with at least some (all being shown) of second material 18 (not shown as such has been removed) of second-material tiers 14 being etched therewith selectively relative to first-material tiers 12 and selectively relative to solid material 38 to form void space 28 elevationally between immediately-adjacent first-material tiers 12. Subsequent processing may occur as described above with respect to FIGS. 6-11.

In any of the above-described embodiments, central portions of channel openings 20 may be filled with solid insulator material or be hollow. Further, trenches 36 may individually comprise one or more hollow portions.

The FIGS. 13-17 method may result in an example finished construction of an array of transistors that is devoid of any elevationally-extending dummy structures laterally between trenches 36 and solid material 38 therein. Alternately, elevationally-extending dummy structures may be formed that are laterally between trenches 36 and solid material 38 therein in a finished construction of the transistor array in connection with the fabrication described above relative to FIGS. 13-17. Any other attribute(s) or aspect(s) as shown and/or described herein with respect to other embodiments may be used.

An embodiment of the invention encompasses a method used in forming an array (e.g., 15) of elevationally-extending transistors (e.g., 40). Such comprises forming vertically-alternating tiers (e.g., 12, 14) of insulating material (e.g., 16) and void space (e.g., 28 in FIG. 5) and in some embodiments regardless of predecessor construction or how or when such vertically-alternating tiers are formed. Individual longitudinally-aligned channel openings (e.g., 26 in FIG. 5) extend elevationally through the insulating-material tiers and in some embodiments regardless of predecessor construction or how or when such are formed.

The void-space tiers (e.g., 14) are filled with conductive material (e.g., 30) by flowing the conductive material or one or more precursors thereof through the channel openings to into the void-space tiers. Such filling forms the conductive material elevationally along the insulating-material tiers (e.g., 12) within the individual channel openings. The conductive material is removed from being elevationally along the insulating-material tiers within the individual channel openings after such act of filling. Transistor channel material (e.g., 35) is formed in the individual channel openings along the insulating-material tiers and along the conductive material in the filled void-space tiers after such removing of the conductive material from being along the insulating-material tiers in the channel openings.

In one embodiment, horizontally-elongated trenches (e.g., 36) are formed elevationally into the insulating-material tiers 12 and solid material (e.g., 38) is formed therein. In one such embodiment, the trenches and the solid material therein are formed after forming the individual channel openings. In one embodiment, elevationally-extending dummy structures (e.g., 24) are formed through the insulating-material tiers that are laterally between the trenches in a finished construction of the array.

In one embodiment, the trenches and the solid material therein are formed before forming the individual channel openings, and in one such embodiment the solid material therein comprises transistor channel material, for example as is described below.

Any other attribute(s) or aspect(s) as shown and/or described herein with respect to other embodiments may be used.

An embodiment of the invention comprises a method used in forming an array (e.g., 15) of elevationally-extending transistors (e.g., 40). Such includes forming vertically-alternating tiers (e.g., 12, 14) of insulating material (e.g., 16) and void space (e.g., 28 in FIG. 5), and in some embodiments regardless of predecessor construction or how or when such vertically-alternating tiers of the insulating material and the void space are formed. Individual longitudinally-aligned channel openings (e.g., 26) are ultimately formed to extend elevationally through the insulating-material tiers (e.g., 12) and in some embodiments regardless of predecessor construction or how or when such are formed. Horizontally-elongated trenches (e.g., 36) are ultimately formed which extend elevationally through the insulating-material tiers, and in some embodiments regardless of predecessor construction or how or when such are formed. The void-space tiers (e.g., 14) are filled with conductive material (e.g., 30) by flowing the conductive material or one or more precursors thereof through at least one of the channel openings or the trenches into the void-space tiers. After filling the void-space tiers, transistor channel material (e.g., 35) is formed in the individual channel openings along the insulating-material tiers and along the conductive material in the filled void-space tiers.

In one embodiment, the flowing is through the channel openings, in one embodiment is through the trenches, and in one embodiment is through both. In one embodiment, the flowing is only through the channel openings and is not through the trenches. In one such embodiment, the trenches and the so lid material formed therein are formed before flowing the etchant through the channel openings. In an alternate such embodiment, the trenches and solid material therein are formed after flowing the etchant through the channel openings.

In one embodiment, the etchant is flowed only through the trenches and not through the channel openings. In one such embodiment, the channel openings and the solid material formed therein are formed after flowing the etchant through the trenches. In an alternate such embodiment, the channel openings and the solid material formed therein are formed before flowing the etchant through the trenches. In one embodiment, the transistor channel material is formed in the trenches while forming the transistor channel material in the individual channel openings and which remains in the trenches in a finished construction of the array, for example as is described below.

In one embodiment, elevationally-extending dummy-structure openings (e.g., 20) are formed through the insulating-material tiers before forming the void-space tiers. In one such embodiment, the trenches are formed before forming the void-space tiers. The transistor channel material is formed in the dummy-structure openings and in the trenches while forming the transistor channel material in the individual channel openings and which remains in the dummy-structure openings and in the trenches in a finished construction of the transistor array, for example as is described below.

Any other attribute(s) or aspect(s) as shown and/or described herein with respect to other embodiments may be used.

An alternate example embodiment method used in forming an array of elevationally-extending transistors is shown in and next described with reference to FIGS. 18-24 with respect to a construction 10*c*. Like numerals from the above-described embodiments have been used where appropriate, with some construction differences being indicated with the suffix "c" or with different numerals.

Figure 18:
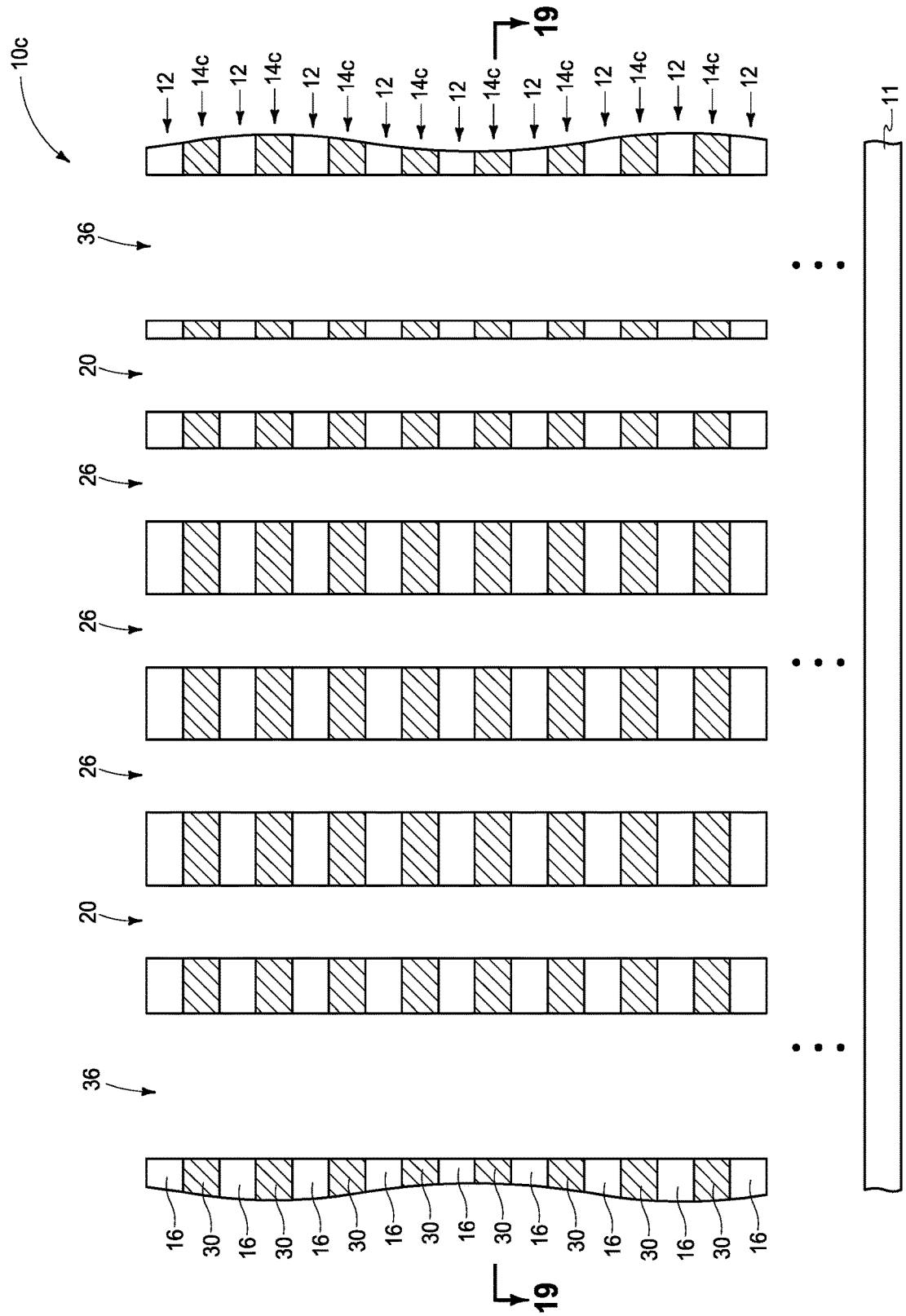
FIG. 18 is a diagrammatic cross-sectional view of a substrate construction in process in accordance with an embodiment of the invention, and is taken through line 18-18 in FIG. 19.
Figure 19:
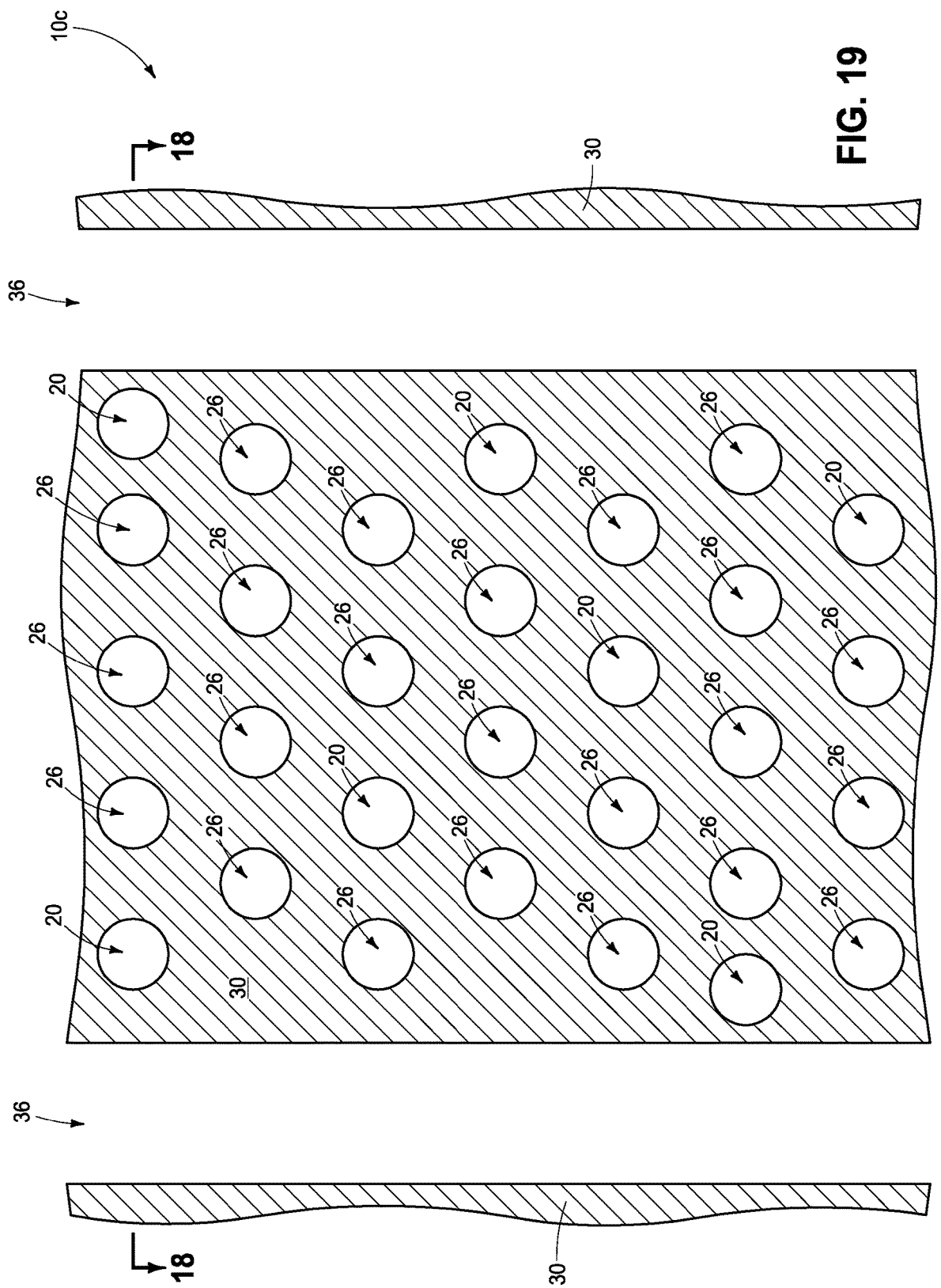
FIG. 19 is a diagrammatic cross-sectional view taken through line 19-19 in FIG. 18.

Referring to FIGS. 18 and 19, such an example method includes forming vertically-alternating tiers (e.g., 12, 14*c*) of different composition first material (e.g., 16) and second material (e.g., 30*c*), with the first material being insulative and the second material being conductive. Elevationally-extending dummy-structure openings (e.g., 20) are formed into the vertically-alternating tiers. Elevationally-extending channel openings (e.g., 26) are formed into the vertically-alternating tiers. Horizontally-elongated trenches (e.g., 36) are formed to extend elevationally into the vertically-alternating tiers. Openings 20, openings 26, and trenches 36 may be formed separately, in any order relative one another, formed simultaneously with respect to all three, formed simultaneously with respect to any two, etc.

Figure 20:
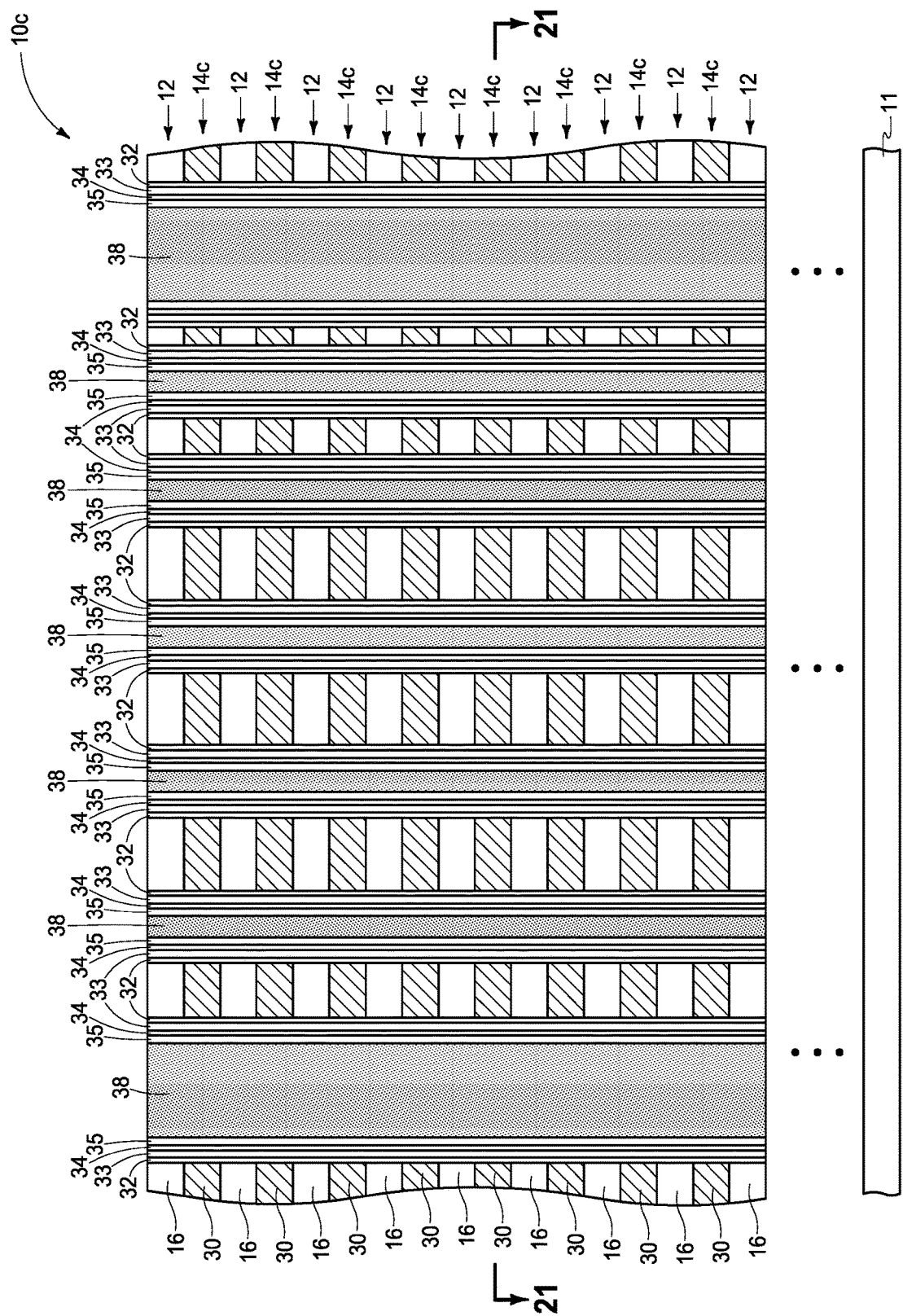
FIG. 20 is a view of the FIG. 18 construction at a processing step subsequent to that shown by FIG. 18, and is taken through line 20-20 in FIG. 21.
Figure 21:
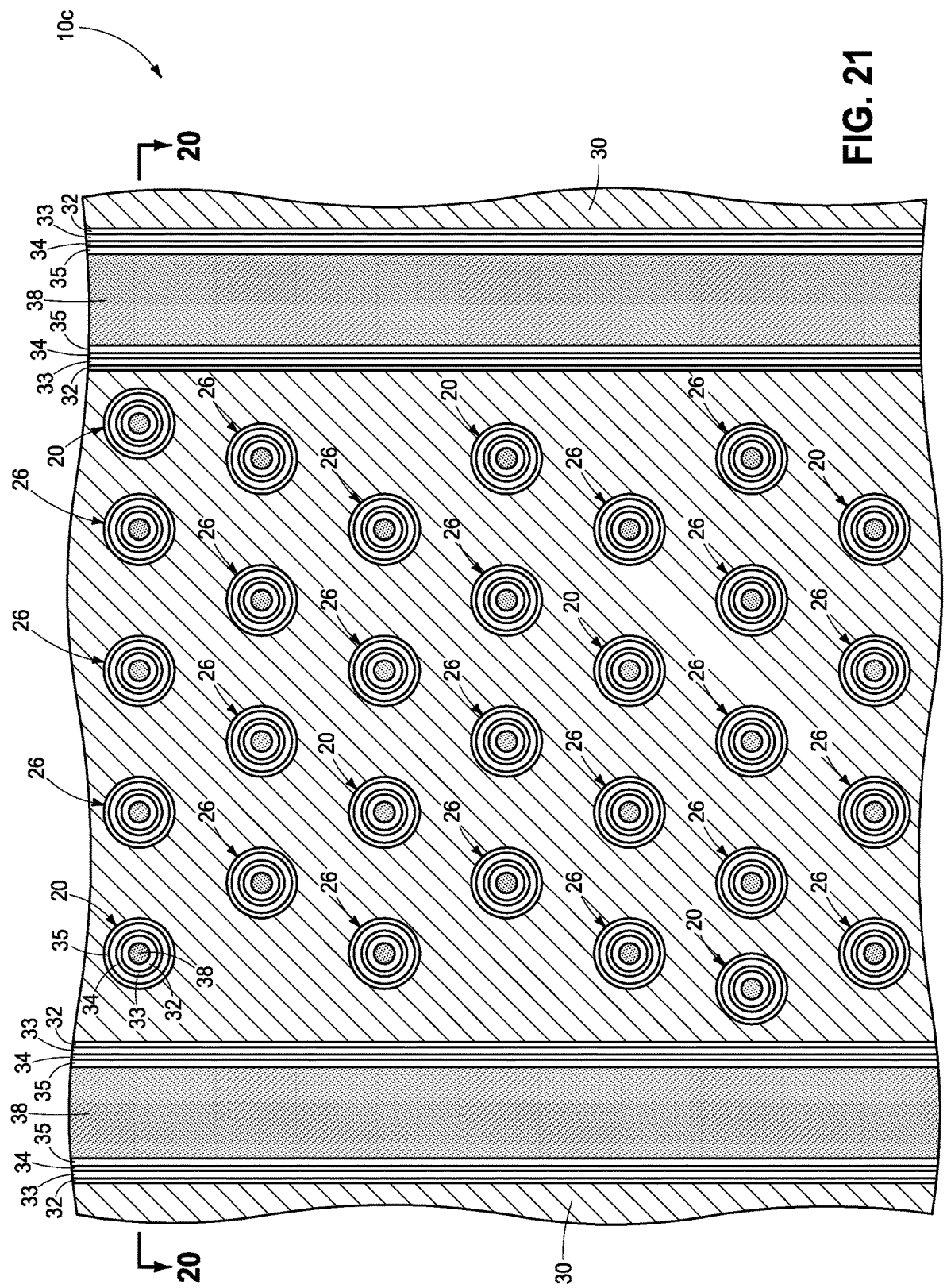
FIG. 21 is a view taken through line 21-21 in FIG. 20.

Referring to FIGS. 20 and 21, multiple different composition of the same solid materials (e.g., 32, 33, 34, 35) are simultaneously formed into each of the dummy structure openings, the channel openings, and the trenches.

Figure 22:
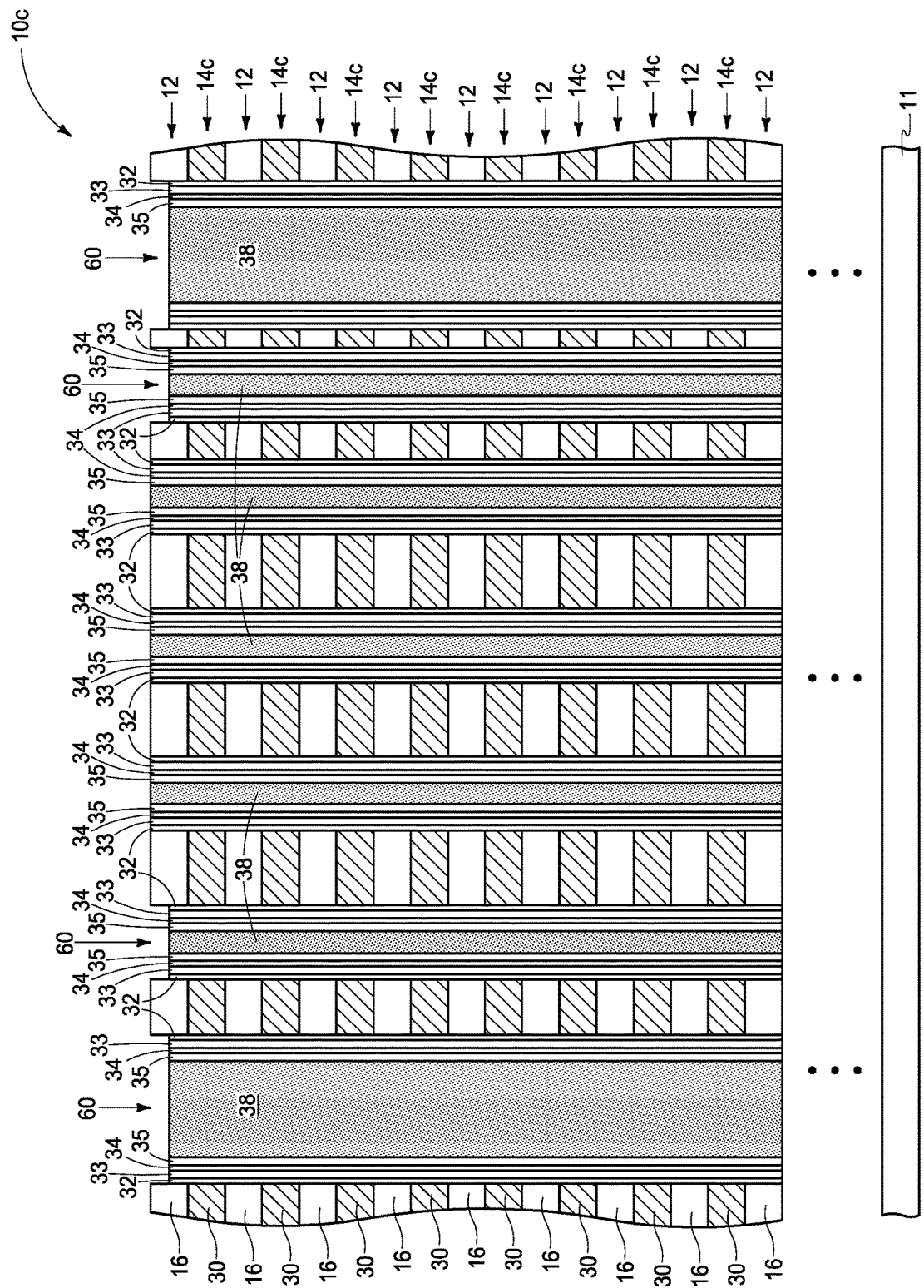
FIG. 22 is a view of the FIG. 20 construction at a processing step subsequent to that shown by FIG. 20.

Referring to FIG. 22, the solid materials in the dummy-structure openings and in the trenches have been elevationally recessed to form elevational recesses (e.g., 60) (e.g., by etching, with the solid materials in the channel openings being masked [not shown] during such etching).

Figure 23:
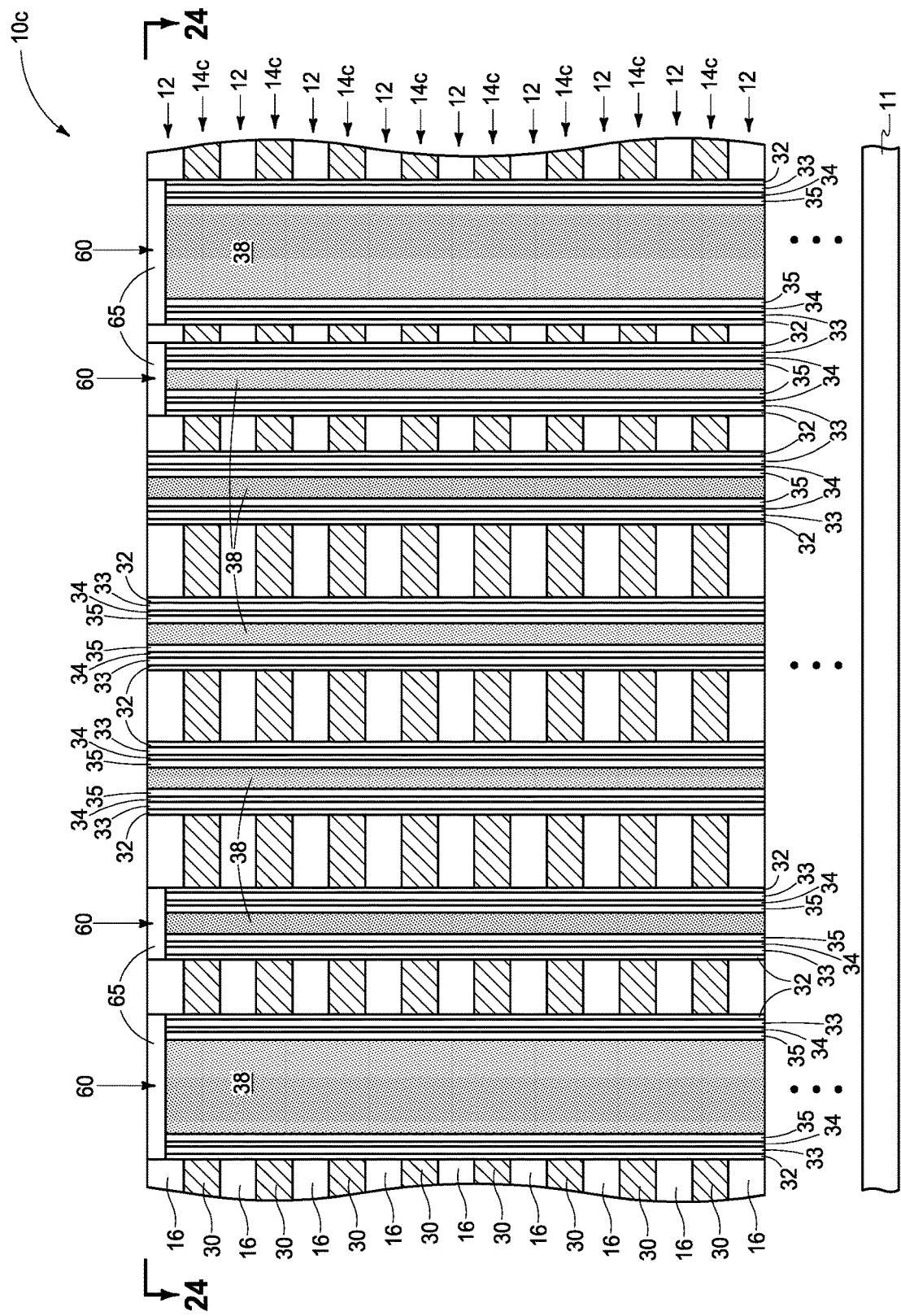
FIG. 23 is a view of the FIG. 22 construction at a processing step subsequent to that shown by FIG. 22, and is taken through line 23-23 in FIG. 24.
Figure 24:
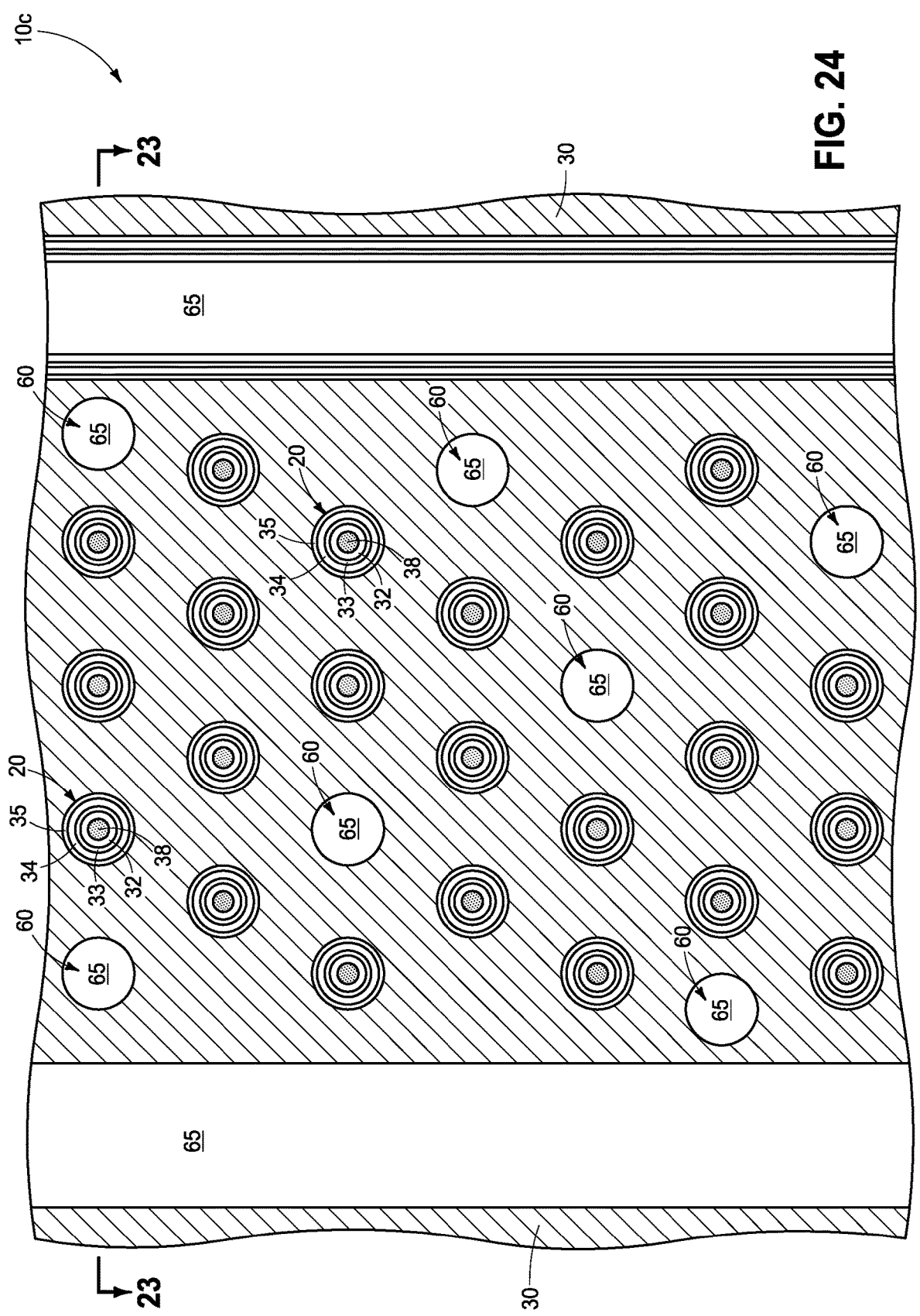
FIG. 24 is a view taken through line 24-24 in FIG. 23.

Referring to FIGS. 23 and 24, thereafter the elevational recesses are filled with insulating material 65 (e.g., silicon nitride and/or silicon dioxide). For example, such may be formed by deposition of material 65 to fill elevational recesses 60, followed by polishing or etching material 65 back at least to elevationally-outermost surfaces of the elevationally-outermost insulating material tier.

Any other attribute(s) or aspect(s) as shown and/or described herein with respect to other embodiments may be used.

Figure 25:
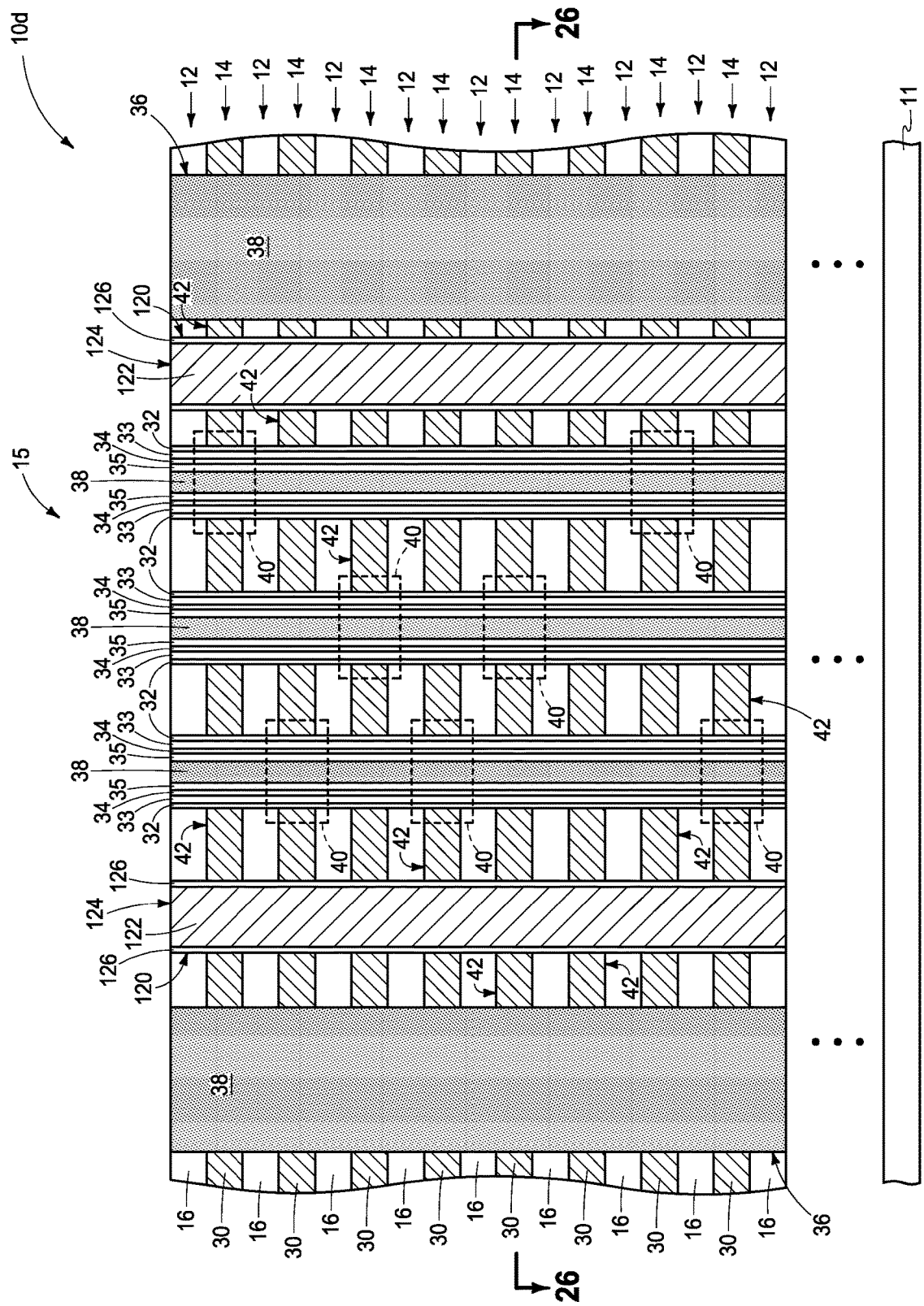
FIG. 25 is a diagrammatic cross-sectional view of a substrate construction in process in accordance with an embodiment of the invention, and is taken through line 25-25 in FIG. 26.
Figure 26:
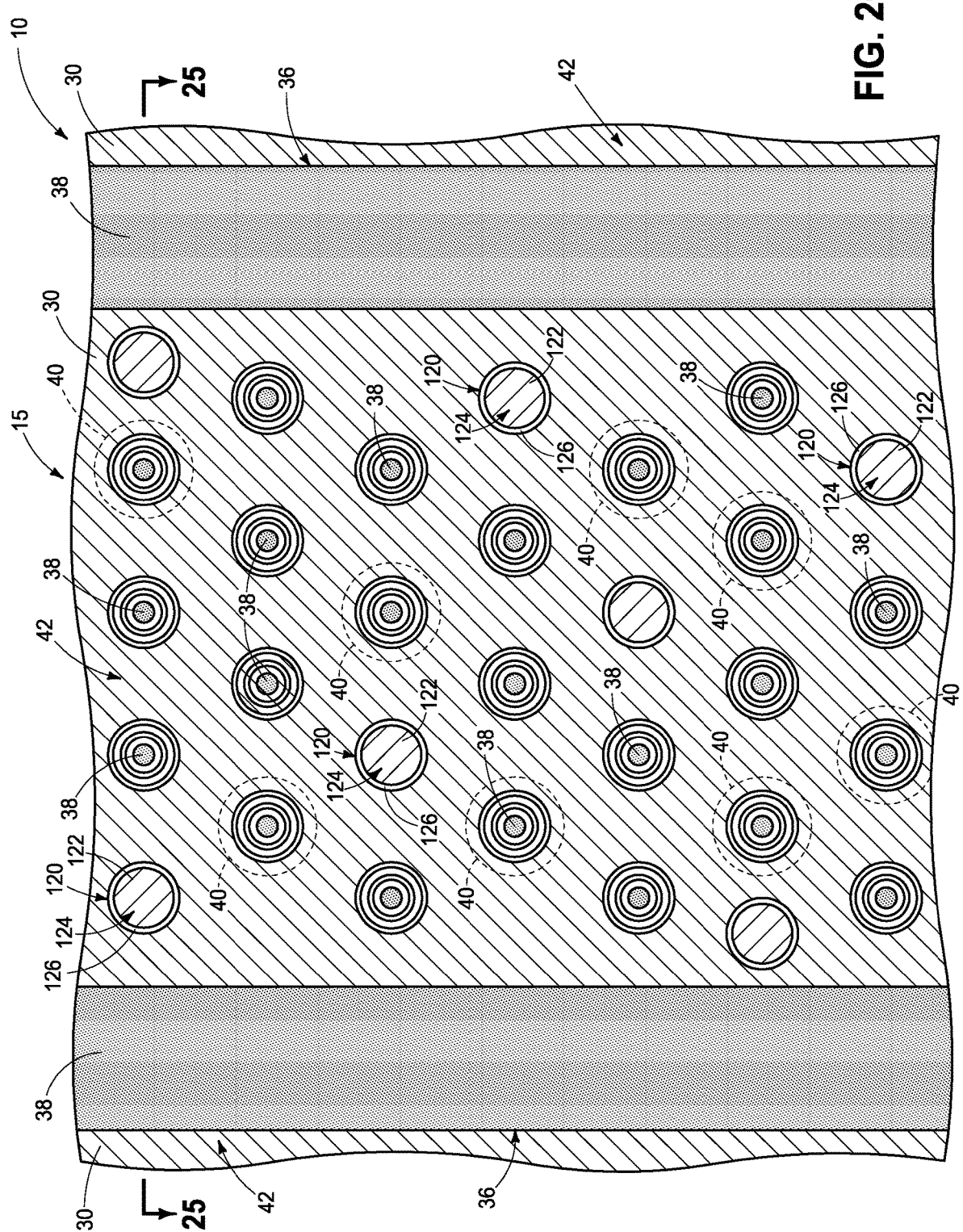
FIG. 26 is a diagrammatic cross-sectional view taken through line 26-26 in FIG. 25.

Another example method used in forming an array of elevationally-extending transistors is shown in and next described with reference to FIGS. 25 and 26 with respect to a construction 10*d*. Like numerals from the above-described embodiments have been used where appropriate, with some construction differences being indicated with the suffix "d" or with different numerals.

In any of the above embodiments, elevationally-extending through-array-via openings may be formed in addition to or in place of dummy-structure openings. By way of example only, through-array-via openings 120 are shown in construction 10*d* in place of dummy-structure openings 20 in the above-described embodiments. Elevationally-extending and electrically-operative (i.e., not "dummy") through-array vias 124 have been formed in individual through-array via openings 120. Vias 124 are shown as comprising a conductive core 122 (e.g., metal material) having a radially-outermost insulative material 126 (e.g., silicon dioxide and/or silicon nitride), with vias 124 remaining in a finished construction of the array. Through-array-via openings 120 and vias 124 may be formed at any time, for example, as described above with respect to the above-described embodiments with respect to dummy structure openings 20 and dummy structures 24. Any other attribute(s) or aspect(s) as shown and/or described herein with respect to other embodiments may be used.

In some embodiment, any one or more of the elevationally-extending features is formed to be vertical or within 10° of vertical.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extending elevationally" refer to a direction that is angled away by at least 45° from exactly horizontal. Further, "extend(ing) elevationally" and "elevationally-extending" with respect to a field effect transistor are with reference to orientation of the transistor's channel length along which current flows in operation between the source/drain regions. For bipolar junction transistors, "extend(ing) elevationally" and "elevationally-extending" are with reference to orientation of the base length along which current flows in operation between the emitter and collector.

Further, "directly above" and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "under" not preceded by "directly" only requires that some portion of the stated region/material/component that is under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other, and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Additionally, "metal material" is any one or combination of an elemental metal, a mixture or an alloy of two or more elemental metals, and any conductive metal compound.

Use of "row" and "column" in this document is for convenience in distinguishing one series or orientation of lines from another series or orientation of lines and along which features have been or will be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles.

In this document, a selective etch or removal is an etch or removal where one material is removed relative to another stated material or materials at a rate of at least 2.0:1.

In this document, a "dummy structure" refers to a structure which is used to mimic a physical property of another structure (e.g., presence, or load-carrying ability of an operative structure) and which may comprise a circuit inoperable electrical dead end (e.g., is not part of a current flow path of a circuit even if conductive). Openings in which dummy structures are formed may be considered as "dummy-structure openings".

CONCLUSION

In some embodiments, a method used in forming an array of elevationally-extending transistors comprises forming vertically-alternating tiers of insulating material and void space. Such method includes forming (a) individual longitudinally-aligned channel openings extending elevationally through the insulating-material tiers, and (b) horizontally-elongated trenches extending elevationally through the insulating-material tiers. The void-space tiers are filled with conductive material by flowing the conductive material or one or more precursors thereof through at least one of (a) and (b) to into the void-space tiers. After the filling, transistor channel material is formed in the individual channel openings along the insulating-material tiers and along the conductive material in the filled void-space tiers.

In some embodiments, a method used in forming an array of elevationally-extending transistors comprises forming vertically-alternating tiers of insulating material and void space. Individual longitudinally-aligned channel openings extend elevationally through the insulating-material tiers. The void-space tiers are filled with conductive material by flowing the conductive material or one or more precursors thereof through the channel openings to into the void-space tiers. The filling forms the conductive material elevationally along the insulating-material tiers within individual of the channel openings. After the filling, the conductive material is removed from being elevationally along the insulating-material tiers within the individual channel openings. Transistor channel material is formed in the individual channel openings along the insulating-material tiers and along the conductive material in the filled void-space tiers after the removing.

In some embodiments, a method used in forming an array of elevationally-extending transistors comprises forming vertically-alternating tiers of different composition first and second materials, with the first material being insulative. Elevationally-extending dummy structures are formed through the vertically-alternating tiers. Elevationally-extending channel openings are formed into the vertically-alternating tiers after forming the dummy structures. An etchant is flowed into the channel openings and at least some of the second material of the second-material tiers is etched therewith selectively relative to the first-material tiers and selectively relative to the dummy structures to form void space elevationally between immediately-adjacent of the first-material tiers. The void-space is filled with conductive material by flowing the conductive material or one or more precursors thereof through the channel openings to into the void space. The filling forms the conductive material elevationally along the first-material tiers within individual of the channel openings. After filling the void space, the conductive material is removed from being elevationally along the first-material tiers within the individual channel openings. Transistor channel material is in the individual channel openings along the insulating-material tiers and along the conductive material in the filled void space after the removing. Horizontally-elongated trenches are formed to extend elevationally through the first-material tiers. Solid material is formed within said trenches.

In some embodiments, a method used in forming an array of elevationally-extending transistors comprises forming vertically-alternating tiers of different composition first and second materials, with the first material being insulative. Horizontally-elongated trenches are formed to extend elevationally into the vertically-alternating tiers. Solid material is formed with said trenches. At least a laterally-outermost portion of the solid material along longitudinal sides of individual of the trenches is insulative. Elevationally-extending channel openings are formed into the vertically-alternating tiers after forming the solid material and laterally between the trenches. An etchant is flowed into the channel openings and at least some of the second material of the second-material tiers is etched therewith selectively relative to the first-material tiers and selectively relative to the solid material to form void space elevationally between immediately-adjacent of the first-material tiers. The void space is filled with conductive material by flowing the conductive material or one or more precursors thereof through the channel openings to into the void space. The filling forms the conductive material elevationally along the first-material tiers within individual of the channel openings. The void space is filled with conductive material by flowing the conductive material or one or more precursors thereof through the channel openings to into the void space. The filling forms the conductive material elevationally along the first-material tiers within individual of the channel openings. After filling the void space, the conductive material is removed from being elevationally along the first-material tiers within the individual channel openings. Transistor channel material is formed in the individual channel openings along the insulating-material tiers and along the conductive material in the filled void space after the removing.

In some embodiments, a method used in forming an array of elevationally-extending transistors comprises forming vertically-alternating tiers of different composition first and second materials, with the first material being insulative and the second material being conductive. Elevationally-extending dummy-structure openings are formed into the vertically-alternating tiers. Elevationally-extending channel openings are formed into the vertically-alternating tiers. Horizontally-elongated trenches are formed to extend elevationally into the vertically-alternating tiers. Multiple different composition of the same solid materials are simultaneously formed into each of the dummy structure openings, the channel openings, and the trenches. The solid materials in the dummy-structure openings and in the trenches are elevationally recessed to form elevational recesses. Such recesses are filled with insulating material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:
1. A method used in forming an array of elevationally-extending transistors, comprising:
 forming vertically-alternating tiers of different composition first and second materials, the first material being insulative and the second material being conductive;
 forming elevationally-extending dummy-structure openings into the vertically-alternating tiers;

forming elevationally-extending channel openings into the vertically-alternating tiers;

forming horizontally-elongated trenches extending elevationally into the vertically-alternating tiers;

simultaneously forming multiple different composition of the same solid materials into each of the dummy structure openings, the channel openings, and the trenches;

elevationally recessing the solid materials in the dummy-structure openings and in the trenches to form elevational recesses; and filling such recesses with insulating material.

2. The method of claim 1 wherein the dummy-structure openings, the channel openings, and the horizontally-elongated trenches are formed simultaneously.

3. The method of claim 1 wherein two of all of the dummy-structure openings, all of the channel openings, and all the horizontally-elongated trenches are formed simultaneously.

4. The method of claim 1 wherein the dummy-structure openings are formed before forming the channel openings.

5. The method of claim 1 wherein the dummy-structure openings are formed before forming the horizontally-elongated trenches.

6. The method of claim 1 wherein the channel openings are formed before forming the horizontally-elongated trenches.

7. The method of claim 1 wherein the elevationally recessing comprises etching.

8. The method of claim 1 wherein the filling comprises deposition of the insulating material to fill the elevational recesses, followed by polishing the insulating material back at least to elevationally-outermost surfaces of an elevationally-outermost of the tiers.

9. The method of claim 1 wherein the filling comprises deposition of the insulating material to fill the elevational recesses, followed by etching the insulating material back at least to elevationally-outermost surfaces of an elevationally-outermost of the tiers.

10. The method of claim 1 comprising forming electrically-operative elevationally-extending through-array vias that are in a finished construction of the array.

11. The method of claim 1 comprising forming electrically-operative elevationally-extending through-array vias that are laterally between the trenches and in a finished construction of the array.

12. The method of claim 1 wherein the solid materials comprise charge-blocking material.

13. The method of claim 1 wherein the solid materials comprise charge-storage material.

14. The method of claim 1 wherein the solid materials comprise charge-passage material.

15. The method of claim 1 wherein the solid materials comprise transistor channel material.

16. The method of claim 1 wherein the solid materials comprise charge-blocking material and charge-storage material.

17. The method of claim 1 wherein the solid materials comprise charge-blocking material and charge-passage material.

18. The method of claim 1 wherein the solid materials comprise charge-blocking material and transistor channel material.

19. The method of claim 1 wherein the solid materials comprise charge-storage material and charge-passage material.

20. The method of claim 1 wherein the solid materials comprise charge-storage material and transistor channel material.

* * * * *